(12) United States Patent
Yonekura et al.

(10) Patent No.: US 7,734,124 B2
(45) Date of Patent: Jun. 8, 2010

(54) OPTICAL WAVEGUIDE AND METHOD OF MANUFACTURING THE SAME, AND METHOD OF MANUFACTURING OPTICAL/ELECTRICAL HYBRID SUBSTRATE

(75) Inventors: Hideki Yonekura, Nagano (JP);
Kazunao Yamamoto, Nagano (JP);
Takanori Yamamoto, Nagano (JP);
Kenji Yanagisawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 12/118,140

(22) Filed: May 9, 2008

(65) Prior Publication Data
US 2008/0279518 A1 Nov. 13, 2008

(30) Foreign Application Priority Data
May 11, 2007 (JP) ............................. 2007-126488

(51) Int. Cl.
*G02B 6/12* (2006.01)
(52) U.S. Cl. ........................................................ 385/14
(58) Field of Classification Search .................. None
See application file for complete search history.

(56) References Cited

U.S. PATENT DOCUMENTS 7,203,387 B2 * 4/2007 Doan .......................... 385/14
2006/0110114 A1 * 5/2006 Yanagisawa et al. ........ 385/129

FOREIGN PATENT DOCUMENTS

JP 2001-281479 10/2001

* cited by examiner

*Primary Examiner*—Omar Rojas
(74) *Attorney, Agent, or Firm*—Drinker Biddle & Reath LLP

(57) ABSTRACT

An optical waveguide includes an optical waveguide main body and mirrors. The optical waveguide main body includes a first cladding layer, a second cladding layer and a core portion provided between the first cladding layer and the second cladding layer. The optical waveguide main body has a first region in which the core portion and the mirrors are arranged and the light signal is transmitted, and a second region arranged on both sides of the first region and not contributing to a transmission of a light signal. Through vias that pass through the optical waveguide main body is provided in the second region. The first region on a side that faces the light emitting element or the light receiving element is protruded larger than the second region on a side that faces the light emitting element or the light receiving element.

9 Claims, 27 Drawing Sheets

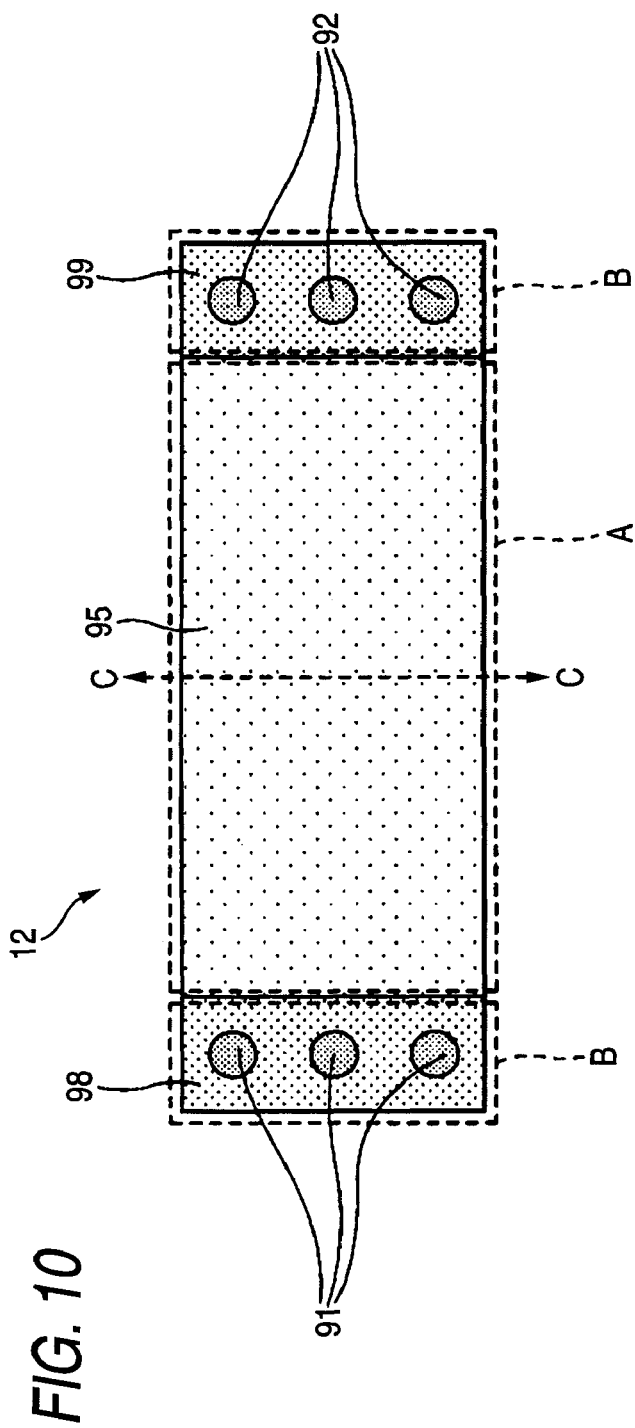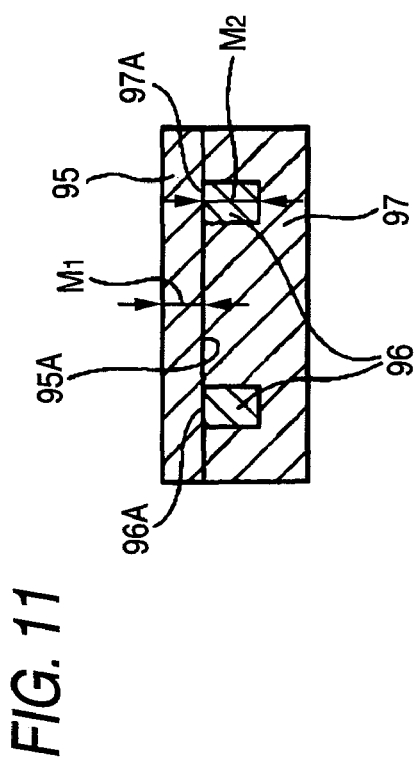

US 7,734,124 B2

OPTICAL WAVEGUIDE AND METHOD OF MANUFACTURING THE SAME, AND METHOD OF MANUFACTURING OPTICAL/ELECTRICAL HYBRID SUBSTRATE

This application is based on and claims priority from Japanese Patent Application No. 2007-126488, filed on May 11, 2007, the entire contents of which are hereby incorporated by reference.

BACKGROUND

1. Technical Field

The present disclosure relates to an optical waveguide and a method of manufacturing the same and a method of manufacturing an optical/electrical hybrid substrate and, more particularly, to an optical waveguide for transmitting a light signal between a light emitting element and a light receiving element, and a method of manufacturing the same, and a method of manufacturing an optical/electrical hybrid substrate.

2. Related Art

In recent years, with the speed-up of an information communication, a light is employed instead of an electric signal as the medium of the information communication. In such optical communication field, the conversion from a light signal to an electric signal and the conversion from the electric signal to the light signal are required, and also various processes such as the optical modulation, etc. in the optical communication are required. Therefore, the development of the optical/electrical hybrid substrate for handling the above converting processes is proceeding.

FIG. 1 is a sectional view showing an optical/electrical hybrid substrate in the related art.

As shown in FIG. 1, an optical/electrical hybrid substrate in the related art includes a wiring substrate 201, an optical waveguide 202, a light emitting element 203, a light receiving element 204, and underfill resins 206, 207.

The wiring substrate 201 has a substrate main body 211, through vias 212 and 213, upper wirings 215, 216, 223 and 224, insulating layers 218 and 231, vias 221, 222, 233 and 234, solder resists 226 and 239, and lower wirings 228, 229, 236 and 237.

The substrate main body 211 is a core substrate shaped like a plate. The through vias 212, 213 are provided to pass through the substrate main body 211. An upper end portion of the through vias 212 is connected to the upper wiring 215, and a lower end portion is connected electrically to the lower wiring 228. An upper end portion of the through vias 213 is connected to the upper wiring 216, and a lower end portion is connected electrically to the lower wiring 229.

The upper wirings 215, 216 are provided on an upper surface 211A of the substrate main body 211. The insulating layer 218 is provided on the upper surface 211A of the substrate main body 211 to cover the upper wirings 215, 216. The via 221 is provided to pass through the insulating layer 218 arranged on the upper wiring 215. A lower end portion of the via 221 is connected to the upper wiring 215. The via 222 is provided to pass through the insulating layer 218 arranged on the upper wiring 216. A lower end portion of the via 222 is connected to the upper wiring 216.

The upper wiring 223 is provided on a portion of the insulating layer 218 corresponding to a forming position of the via 221. The upper wiring 223 is connected to an upper end portion of the via 221. The upper wiring 223 has a pad portion 241 connected electrically to the light emitting element 203. The upper wiring 224 is provided on a portion of the insulating layer 218 corresponding to a forming position of the via 222. The upper wiring 224 is connected to an upper end portion of the via 222. The upper wiring 224 has a pad portion 242 connected electrically to the light receiving element 204.

The solder resist 226 has opening portions that expose the pad portions 241, 242. The solder resist 226 is provided on the insulating layer 218 to cover portions of the upper wirings 223, 224 except the pad portions 241, 242.

The lower wirings 228, 229 are provided on a lower surface 211B of the substrate main body 211. The insulating layer 231 is provided on the lower surface 211B of the substrate main body 211 to cover the lower wirings 228, 229. The via 233 is provided to pass through the insulating layer 231 arranged under the lower wiring 228. An upper end portion of the via 233 is connected to the lower wiring 228. The via 234 is provided to pass through the insulating layer 231 arranged under the lower wiring 229. An upper end portion of the via 234 is connected to the lower wiring 229.

The lower wiring 236 is provided on a lower surface of a portion of the insulating layer 231 corresponding to a forming position of the via 233. The lower wiring 236 is connected to a lower end portion of the via 233. The lower wiring 236 has an external connection pad portion 245. The lower wiring 237 is provided on a lower surface of a portion of the insulating layer 231 corresponding to a forming position of the via 234. The lower wiring 237 is connected to a lower end portion of the via 234. The lower wiring 237 has an external connection pad portion 246.

The solder resist 239 has opening portions that expose the external connection pad portions 245 and 246. The solder resist 239 is provided on the insulating layer 231 to cover portions of the lower wirings 236, 237 except the external connection pad portions 245, 246.

The optical waveguide 202 is bonded to the solder resist 226 with an adhesive agent. The optical waveguide 202 includes: an optical waveguide main body 251 constructed by stacking a cladding layer 255, a core portion 256 and a cladding layer 257; a mirror 253 provided on an inclined surface 251A of the optical waveguide main body 251; and a mirror 254 provided on an inclined surface 251B of the optical waveguide main body 251.

FIG. 2 is a sectional view showing a portion, to which the light emitting element shown in FIG. 1 is connected, of the optical/electrical hybrid substrate in an enlarged manner.

By reference to FIG. 1 and FIG. 2, the light emitting element 203 has a terminal 261 and a light emitting portion 262 for emitting a light signal. The terminal 261 is fixed to the pad portion 241 by a solder 264. The light emitting portion 262 is arranged over the mirror 253 to oppose to the mirror 253 provided to the core portion 256. A light signal emitted from the light emitting portion 262 is reflected to the core portion 256 by the mirror 253.

As the characteristics of an optical/electrical hybrid substrate 200, it is important that a transmission loss of the light signal between the light emitting element 203 and the optical waveguide 202 should be small. In order to reduce a transmission loss of the light signal between the light emitting element 203 and the optical waveguide 202, it is important that a distance $R_1$ from a center position $S_1$ (a center position on an optical axis) of the mirror 253 provided to the core portion 256 to a center position of the pad portion 241 should be set to a predetermined distance $R_A$ and also a distance $N_1$ from the light emitting portion 262 to the center position $S_1$ (the center position the optical axis) of the mirror 253 provided to the core portion 256 should be set to a given distance $N_A$.

FIG. 3 is a sectional view showing a portion, to which the light receiving element shown in FIG. 1 is connected, of the optical/electrical hybrid substrate in an enlarged manner.

By reference to FIG. 1 and FIG. 3, the light receiving element 204 has a terminal 266 and a light receiving portion 267 for receiving the light signal. The terminal 266 is fixed onto the pad portion 242 by the solder 264. The light receiving portion 267 is arranged over the mirror 254 to oppose to the mirror 254 provided to the core portion 256. The light receiving portion 267 is provided to receive the light signal reflected by the mirror 254.

As the characteristics of the optical/electrical hybrid substrate 200, it is important that a transmission loss of the light signal between the light receiving element 204 and the optical waveguide 202 should be small. In order to reduce a transmission loss of the light signal between the light receiving element 204 and the optical waveguide 202, it is important that a distance $R_2$ from a center position $S_2$ (a center position on an optical axis) of the mirror 254 provided to the core portion 256 to a center position of the pad portion 242 should be set to a given distance $R_B$ and also a distance $N_2$ from the light receiving portion 267 to the center position $S_2$ (the center position on the optical axis) of the mirror 254 provided to the core portion 256 should be set to a given distance $N_B$.

The underfill resin 206 is a translucent resin capable of transmitting the light signal, and is provided to fill a clearance between the light emitting element 203 and the wiring substrate 201 and the optical waveguide 202. The underfill resin 207 is a translucent resin capable of transmitting the light signal, and is provided to fill a clearance between the light receiving element 204 and the wiring substrate 201 and the optical waveguide 202.

FIG. 4 to FIG. 7 are views showing steps of manufacturing the optical/electrical hybrid substrate in the related art. In FIG. 4 to FIG. 7, the same reference symbols are affixed to the same constituent portions as those of the optical/electrical hybrid substrate 200 in the related art.

By reference to FIG. 4 to FIG. 7, a method of manufacturing the optical/electrical hybrid substrate 200 in the related art will be described hereunder. At first, in steps shown in FIG. 4, the wiring substrate 201 is formed by the well-known approach.

Then, in steps shown in FIG. 5, the optical waveguide 202 is formed by the well-known approach. Concretely, the cladding layer 257, the core portion 256, and the cladding layer 255 are stacked sequentially on a supporting substrate (concretely, a substrate made of a resin). Then, both end portions of the structure composed of the cladding layer 257, the core portion 256, and the cladding layer 255 are cut by the dicing blade to form the inclined surfaces 251A, 251B. Then, the mirrors 253, 254 are formed by forming a metal film on the inclined surfaces 251A, 251B, and then the supporting substrate is removed. Thus, the optical waveguide 202 is formed.

Then, in steps shown in FIG. 6, the optical waveguide 202 is bonded onto the solder resist 226 of the wiring substrate 201. Then, in steps shown in FIG. 7, the light emitting element 203 and the light receiving element 204 are mounted on the wiring substrate 201, and then the underfill resins 206, 207 are formed. Thus, the optical/electrical hybrid substrate 200 is manufactured (see JP-A-2001-281479, for example).

However, in the optical/electrical hybrid substrate 200 in the related art, the terminal 261 of the light emitting element 203 and the terminal 266 of the light receiving element 204 are connected to the pad portions 241, 242 of the wiring substrate 201 manufactured separately from the optical waveguide 202, respectively. Therefore, it was difficult to position the optical waveguide 202, the light emitting element 203, and the light receiving element 204 on the wiring substrate 201 with good precision such that the distance $R_1$ from the center position $S_1$ (the center position on the optical axis) of the mirror 253 to the center position of the pad portion 241, the distance $N_1$ from the light emitting portion 262 to the center position $S_1$ (the center position on the optical axis) of the mirror 253, the distance $R_2$ from the center position $S_2$ (the center position on the optical axis) of the mirror 254 to the center position of the pad portion 242, and the distance $N_2$ from the light receiving portion 267 to the center position $S_2$ (the center position on the optical axis) of the mirror 254 coincide with the given distances $R_A$, $N_A$, $R_B$, $N_B$ respectively.

As a result, such a problem existed that a transmission loss of the light signal between the light emitting element 203 and the optical waveguide 202 and a transmission loss of the light signal between the light receiving element 204 and the optical waveguide 202 are increased.

SUMMARY

Exemplary embodiments of the present invention provide an optical waveguide capable of reducing a transmission loss of a light signal and a method of manufacturing the same and a method of manufacturing an optical/electrical hybrid substrate.

According to one or more aspects of the present invention, an optical waveguide comprises: an optical waveguide main body comprising: a first cladding layer facing at least one of a light emitting element and a light receiving element; a second cladding layer; and a core portion for transmitting a light signal and provided between the first cladding layer and the second cladding layer; and mirrors for reflecting the light signal; and wherein the optical waveguide main body has: a first region in which the core portion and the mirrors are arranged and the light signal is transmitted; and a second region arranged on both sides of the first region and not contributing to a transmission of the light signal, wherein through vias that pass through the optical waveguide main body is provided in the second region, and the through vias are connected to a terminal of the light emitting element or a terminal of the light receiving element, wherein the first region on a side that faces the light emitting element or the light receiving element is protruded larger than the second region on a side that faces the light emitting element or the light receiving element.

According to the present invention, the through vias that pass through the optical waveguide main body in the second regions and connected to the terminal of the light emitting element and/or the terminal of the light receiving element are provided. Therefore, a relative positional displacement of the actual alignment positions of the light emitting element and the light receiving element from their optimum alignment positions can be reduced as compared with the case where the light emitting element and the light receiving element are mounted on the wiring substrate. As a result, a transmission loss of the light signal between the light emitting element and the optical waveguide and a transmission loss of the light signal between the light receiving element and the optical waveguide can be reduced.

Further, the portion of the optical waveguide main body in the first region on the side that faces the light emitting element or the light receiving element is formed to protrude larger than the portion of the optical waveguide main body in the second region on the side that faces the light emitting element or the light receiving element. Therefore, a light emitting portion of the light emitting element can be arranged in vicinity of the mirror and a light receiving portion of the light receiving element can be arranged in vicinity of the mirror (in other words, the light emitting portion and the light receiving portion can be arranged in vicinity of the optical waveguide). As a result, a transmission loss of the light signal between the light emitting element and the optical waveguide and a transmission loss of the light signal between the light receiving element and the optical waveguide can be reduced.

According to one or more aspects of the present invention, in a method of manufacturing an optical waveguide including an optical waveguide main body having a first region for transmitting a light signal, and a second region arranged on both sides of the first region and not contributing to a transmission of the light signal, the method comprises: (a) forming a first cladding layer on a metal plate in the first region; (b) forming a metal film on the metal plate in the second region such that a thickness of the metal film is substantially equal to a thickness of the first cladding layer; (c) forming a core material to cover upper surfaces of the first cladding layer and the metal film; (d) forming simultaneously a core portion, alignment marks and a first through hole by patterning the core material, said first through hole passing through the core material in the second region; (e) forming inclined surfaces on the core portion by cutting the core portion based on the alignment marks; (f) forming mirrors on the inclined surfaces of the core portion; (g) forming a second cladding layer having a second through hole opposing to the first through hole; (h) removing the metal plate and the metal film; and (i) forming through vias in the first through hole and the second through hole, said through vias being connected to a terminal of a light emitting element and a terminal of a light receiving element.

According to the present invention, the core portion and the alignment marks used in forming the inclined surfaces on the core portion to which the mirrors are provided are formed simultaneously by patterning the core material. Therefore, a production cost of the optical waveguide can be reduced as compared with the case where the core portion and the alignment marks are formed separately.

Further, the inclined surfaces are formed on the core portions by cutting the core portions based on the alignment marks. Therefore, the inclined surfaces can be formed in given positions with good precision. As a result, a positional precision of the inclined surfaces on which the mirrors are formed can be improved, and thus a transmission loss of the light signal between the light emitting element and the optical waveguide and a transmission loss of the light signal between the light receiving element and the optical waveguide can be reduced.

According to one or more aspects of the present invention, in a method of manufacturing an optical/electrical hybrid substrate including an optical waveguide and a built-up structure including an insulating layer, vias and wirings, said optical waveguide including an optical waveguide main body having a first region for transmitting a light signal, and a second region arranged on both sides of the first region and not contributing to a transmission of the light signal, the method comprises: (a) forming a first cladding layer on a metal plate in the first region; (b) forming a metal film on the metal plate in the second region such that a thickness of the metal film is substantially equal to a thickness of the first cladding layer; (c) forming a core material to cover upper surfaces of the first cladding layer and the metal film; (d) forming simultaneously a core portion, alignment marks and a first through hole by patterning the core material, said first through hole passing through the core material in the second region; (e) forming inclined surfaces on the core portion by cutting the core portion based on the alignment marks; (f) forming mirrors on the inclined surfaces of the core portion; (g) forming a second cladding layer having a second through hole opposing to the first through hole; (h) forming through vias in the first through hole and the second through hole, said through vias being connected to a terminal of a light emitting element and a terminal of a light receiving element; (i) forming the built-up structure on the optical waveguide; and (j) removing the metal plate and the metal film.

According to the present invention, the core portion and the alignment marks used in forming the inclined surfaces on the core portion to which the mirrors are provided are formed simultaneously by patterning the core material. Therefore, a production cost of the optical/electrical hybrid substrate can be reduced as compared with the case where the core portion and the alignment marks are formed separately.

Further, the inclined surfaces are formed on the core portions by cutting the core portions based on the alignment marks. Therefore, the inclined surfaces can be formed in given positions with good precision. As a result, a positional precision of the inclined surfaces on which the mirrors are formed can be improved, and thus a transmission loss of the light signal between the light emitting element and the optical waveguide and a transmission loss of the light signal between the light receiving element and the optical waveguide can be reduced.

Moreover, the built-up structure is formed in the optical waveguide. Therefore, a productivity of the optical/electrical hybrid substrate can be improved rather than the case where the optical waveguide and the built-up structure are manufactured separately.

According to the present invention, a transmission loss of the light signal between the light emitting element and the optical waveguide and/or a transmission loss of the light signal between the light receiving element and the optical waveguide can be reduced.

Other aspects and advantages of the invention will be apparent from the following description, the drawings and the claims.

BRIEF DESCRIPTION OF THE DRAWINGS

FIG. 10 is a plan view showing the optical waveguide shown in FIG. 9;

FIG. 11 is a sectional view showing the optical waveguide taken along C-C line of FIG. 10;

DETAILED DESCRIPTION

Exemplary embodiments of the present invention will be described with reference to the drawings hereinafter.

First Embodiment

Figure 1:
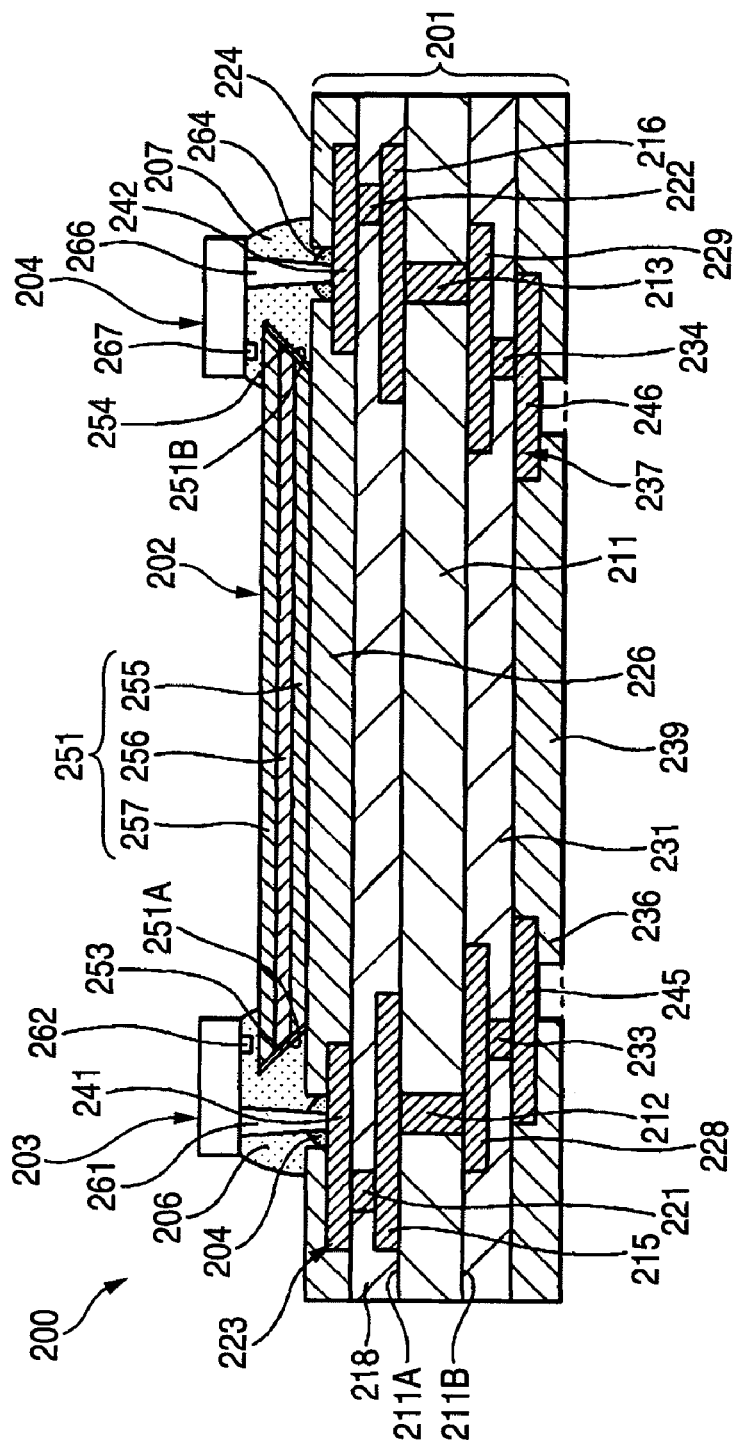
FIG. 1 is a sectional view showing an optical/electrical hybrid substrate in the related art.
Figure 2:
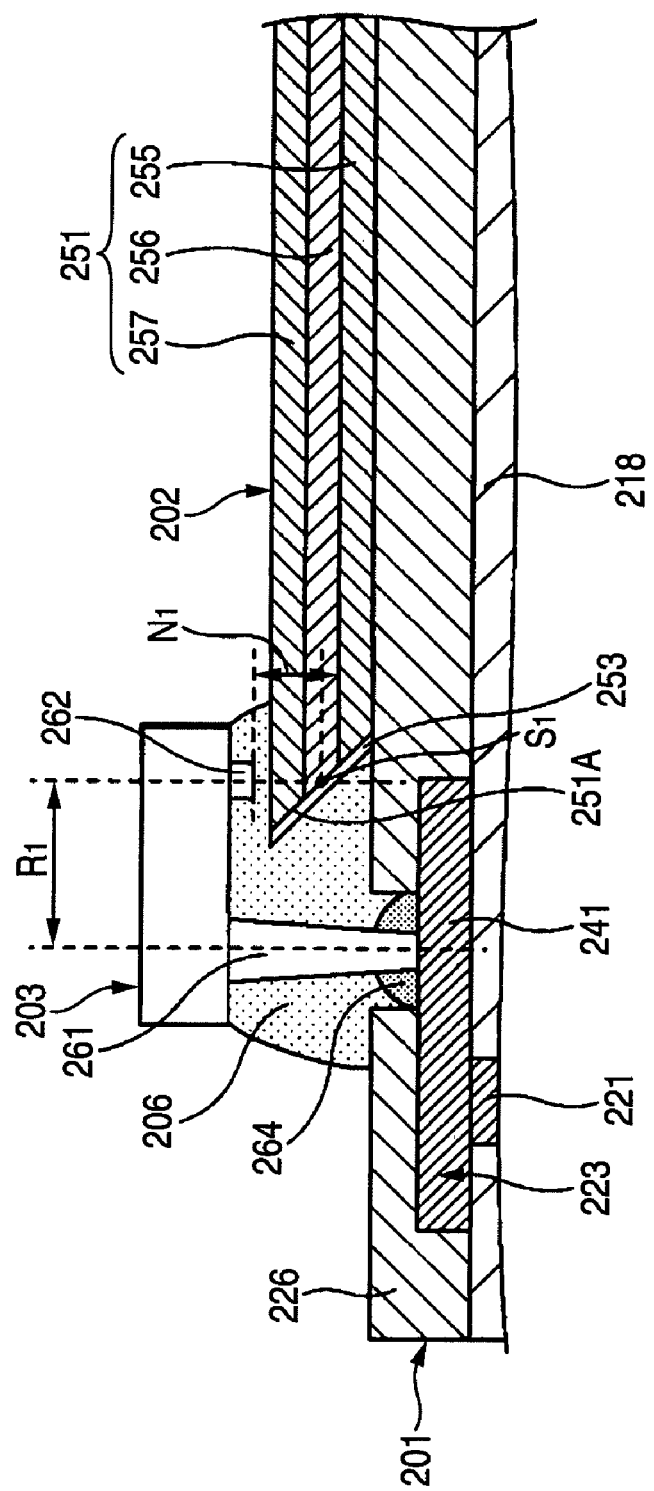
FIG. 2 is a sectional view showing a portion, to which a light emitting element shown in FIG. 1 is connected, of the optical/electrical hybrid substrate in an enlarged manner.
Figure 3:
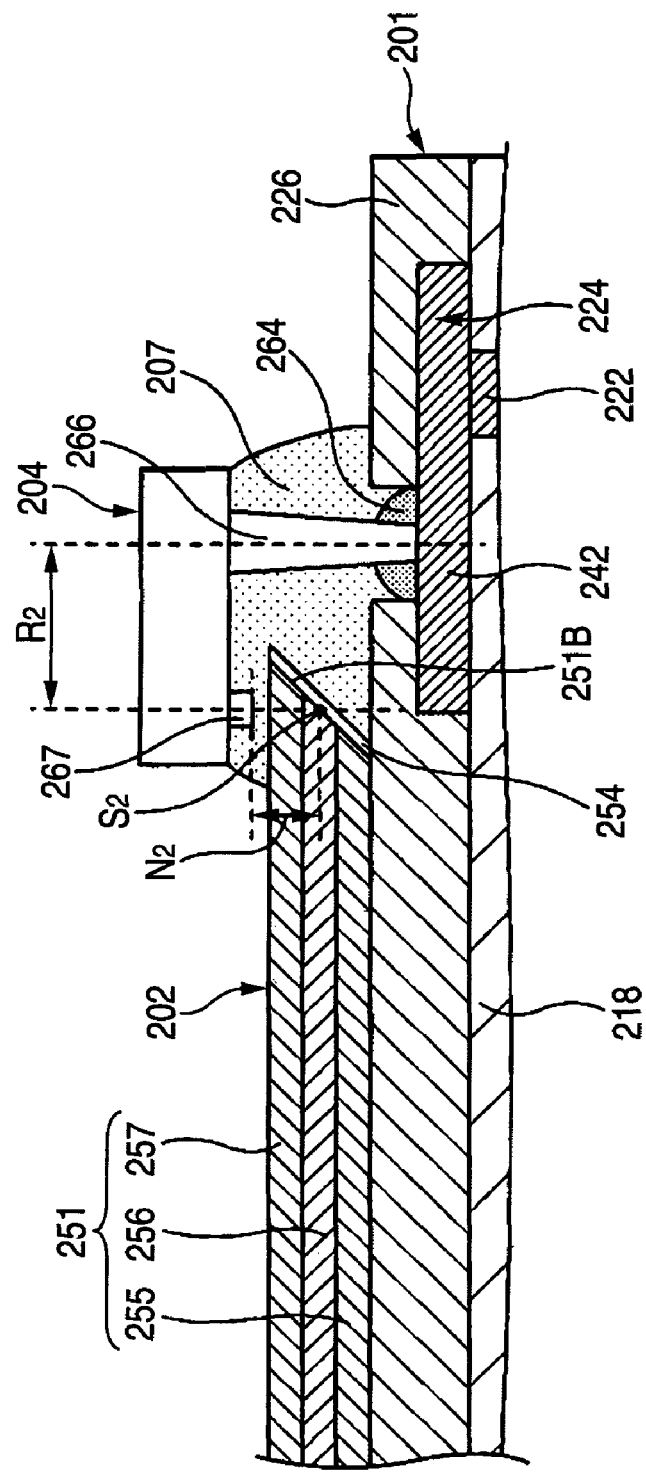
FIG. 3 is a sectional view showing a portion, to which the light receiving element shown in FIG. 1 is connected, of the optical/electrical hybrid substrate in an enlarged manner.
Figure 4:
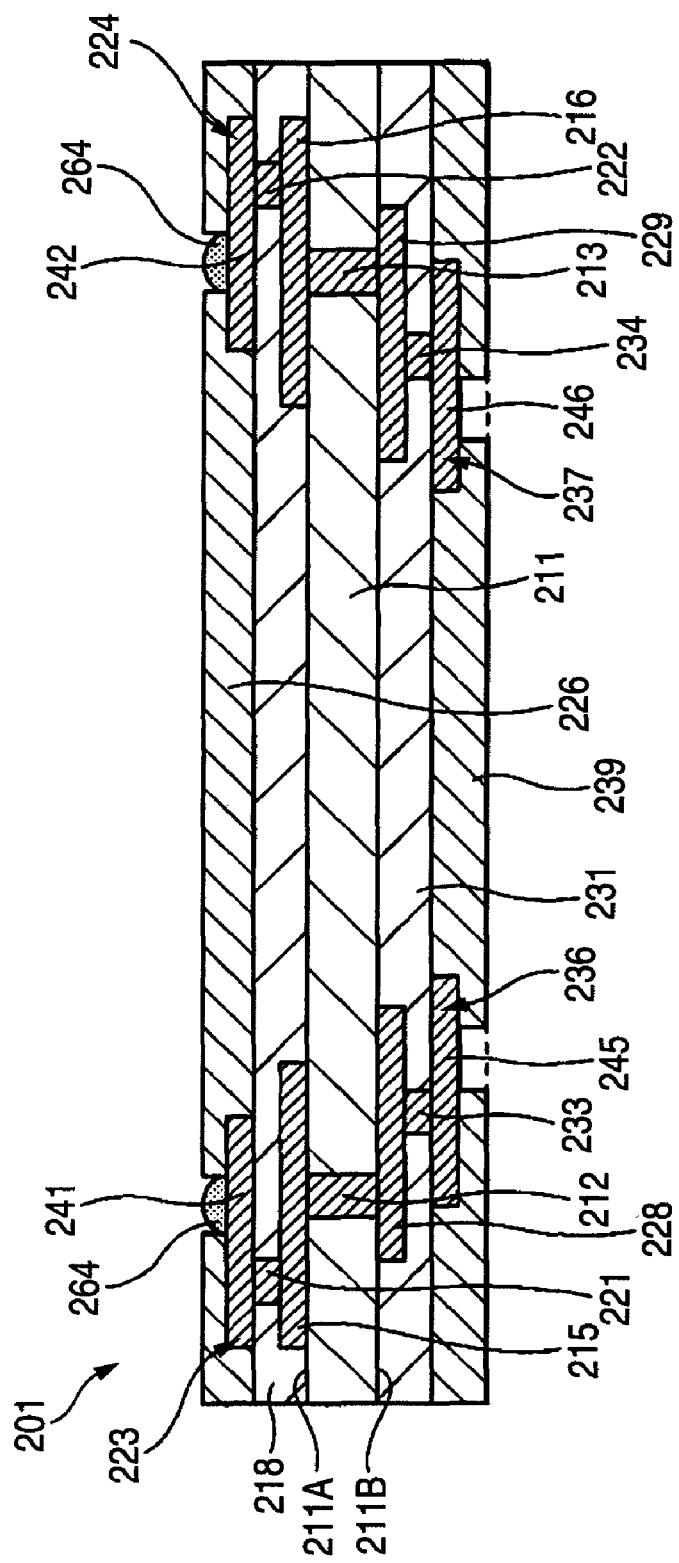
FIG. 4 is a view (#1) showing steps of manufacturing the optical/electrical hybrid substrate in the related art.
Figure 5:
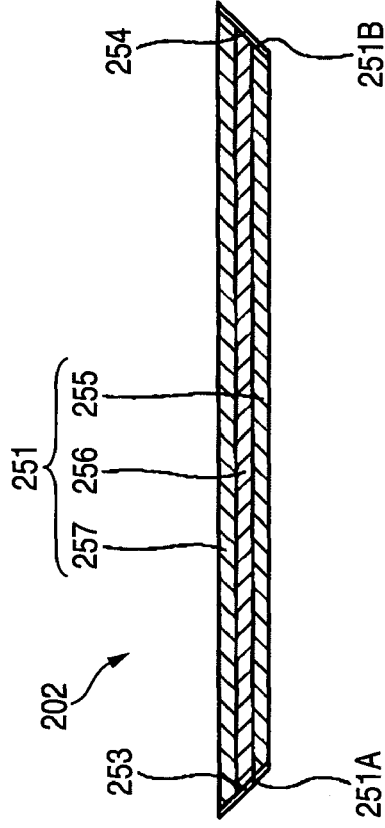
FIG. 5 is a view (#2) showing steps of manufacturing the optical/electrical hybrid substrate in the related art.
Figure 6:
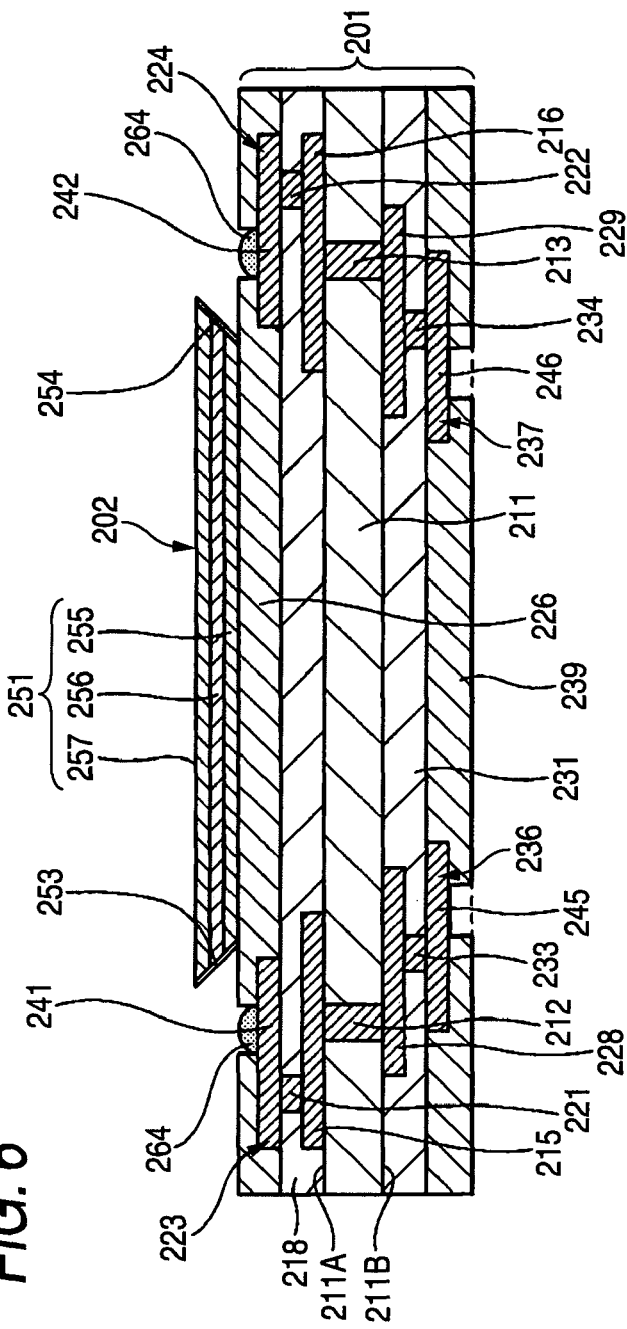
FIG. 6 is a view (#3) showing steps of manufacturing the optical/electrical hybrid substrate in the related art.
Figure 7:
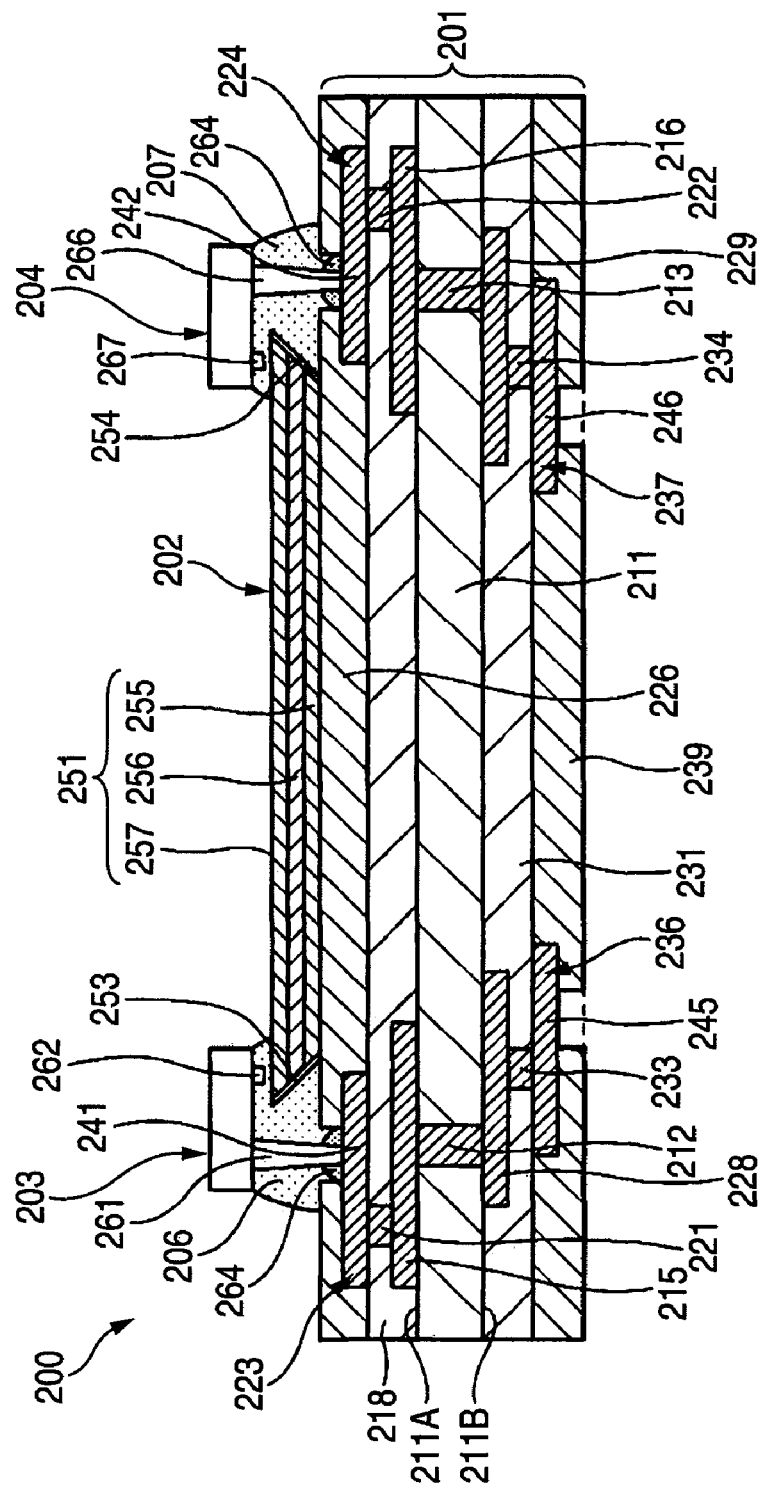
FIG. 7 is a view (#4) showing steps of manufacturing the optical/electrical hybrid substrate in the related art.
Figure 8:
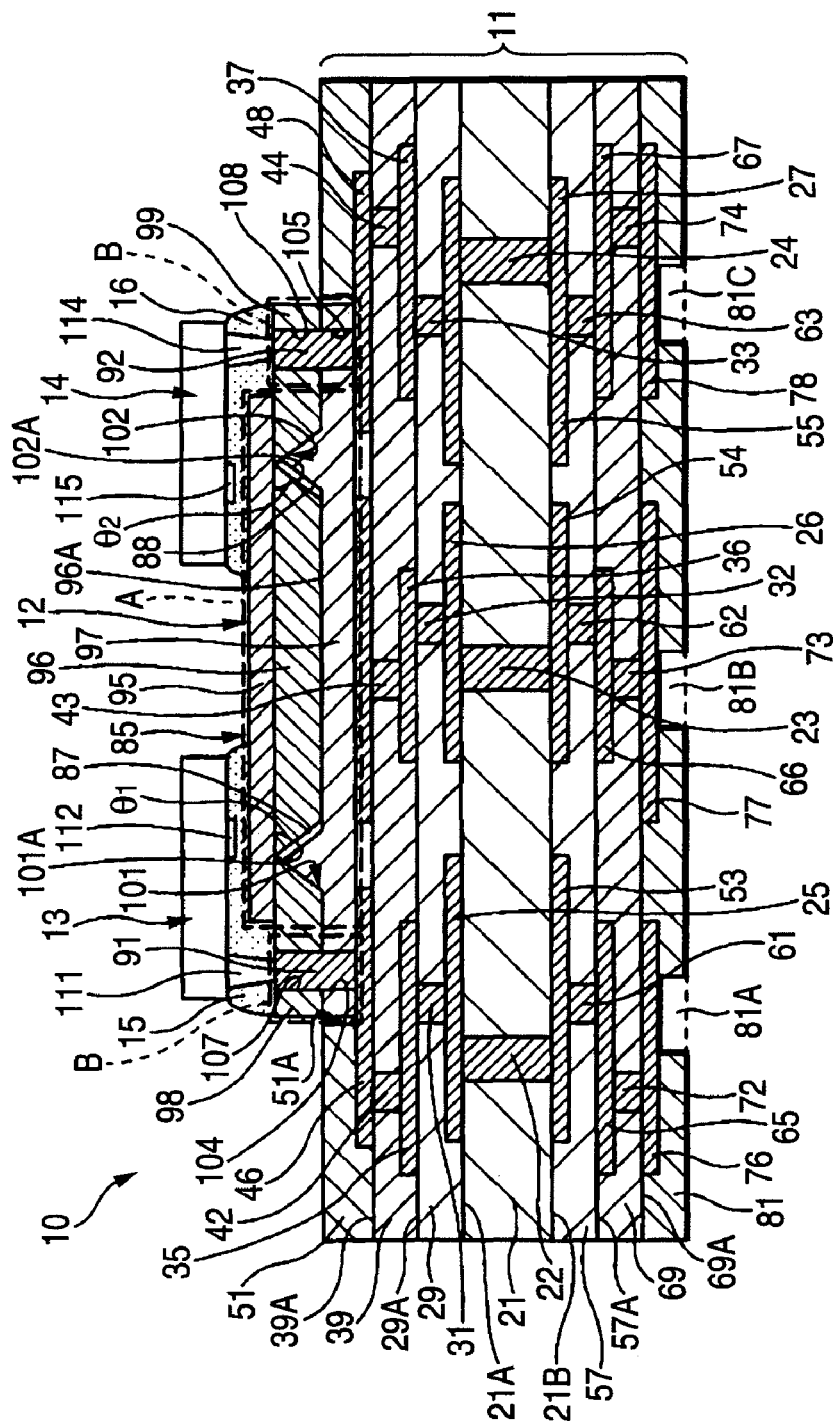
FIG. 8 is a sectional view showing an optical/electrical hybrid substrate according to a first embodiment of the present invention.

FIG. 8 is a sectional view showing an optical/electrical hybrid substrate according to a first embodiment of the present invention.

By reference to FIG. 8, an optical/electrical hybrid substrate 10 of the first embodiment includes a wiring substrate 11, an optical waveguide 12, a light emitting element 13, a light receiving element 14, and underfill resins 15, 16.

The wiring substrate 11 has a substrate main body 21, through vias 22 to 24, wirings 25 to 27, 35 to 37, 46 to 48, 53 to 55, 65 to 67, 76 to 78, vias 31 to 33, 42 to 44, 61 to 63, 72 to 74, insulating layers 29, 39, 57, 69, and solder resists 51, 81.

The substrate main body 21 is a substrate formed like a plate. The through vias 22 to 24 are provided to pass through the substrate main body 21. An upper end portion of the through via 22 is connected to the wiring 25, and a lower end portion is connected to the wiring 53. An upper end portion of the through via 23 is connected to the wiring 26, and a lower end portion is connected to the wiring 54. An upper end portion of the through via 24 is connected to the wiring 27, and a lower end portion is connected to the wiring 55.

The wirings 25 to 27 are provided on an upper surface 21A of the substrate main body 21. The wiring 25 is connected to an upper end portion of the through via 22. The wiring 26 is connected to an upper end portion of the through via 23. The wiring 27 is connected to an upper end portion of the through via 24. The insulating layer 29 is provided on the upper surface 21A of the substrate main body 21 to cover the wirings 25 to 27.

The via 31 is provided to pass through a portion of the insulating layer 29 arranged on the wiring 25. A lower end portion of the via 31 is connected to the wiring 25. The via 32 is provided to pass through a portion of the insulating layer 29 arranged on the wiring 26. A lower end portion of the via 32 is connected to the wiring 26. The via 33 is provided to pass through a portion of the insulating layer 29 arranged on the wiring 27. A lower end portion of the via 33 is connected to the wiring 27.

The wiring 35 to 37 are provided on an upper surface 29A of the insulating layer 29. The wiring 35 is connected to an upper end portion of the via 31. The wiring 36 is connected to an upper end portion of the via 32. The wiring 37 is connected to an upper end portion of the via 33. The insulating layer 39 is provided on the upper surface 29A of the insulating layer 29 to cover the wirings 35 to 37.

The via 42 is provided to pass through a portion of the insulating layer 39 arranged on the wiring 35. A lower end portion of the via 42 is connected to the wiring 35. The via 43 is provided to pass through a portion of the insulating layer 39 arranged on the wiring 36. A lower end portion of the via 43 is connected to the wiring 36. The via 44 is provided to pass through a portion of the insulating layer 39 arranged on the wiring 37. A lower end portion of the via 44 is connected to the wiring 37.

The wirings 46 to 48 are provided on an upper surface 39A of the insulating layer 39. The wiring 46 is connected to an upper end portion of the via 42. The wiring 47 is connected to an upper end portion of the via 43. The wiring 48 is connected to an upper end portion of the via 44.

The solder resist 51 has an opening portion 51A that exposes a part of the upper surface 39A of the insulating layer 39, a part of the wirings 46, 48, and the wiring 47. The opening portion 51A is an area on which optical waveguide 12 is mounted.

The wirings 53 to 55 are provided on a lower surface 21B of the substrate main body 21. The wiring 53 is connected to a lower end portion of the via 22. The wiring 54 is connected to a lower end portion of the via 23. The wiring 55 is connected to a lower end portion of the via 24. The insulating layer 57 is provided on the lower surface 21B of the substrate main body 21 to cover the wirings 53 to 55.

The via 61 is provided to pass through a portion of the insulating layer 57 arranged on the lower surface side of the wiring 53. An upper end portion of the via 61 is connected to the wiring 53. The via 62 is provided to pass through a portion of the insulating layer 57 arranged on the lower surface side of the wiring 54. An upper end portion of the via 62 is connected to the wiring 54. The via 63 is provided to pass through a portion of the insulating layer 57 arranged on the lower surface side of the wiring 55. An upper end portion of the via 63 is connected to the wiring 55.

The wirings 65 to 67 are provided on a lower surface 57A of the insulating layer 57. The wiring 65 is connected to a lower end portion of the via 61. The wiring 66 is connected to a lower end portion of the via 62. The wiring 67 is connected to a lower end portion of the via 63. The insulating layer 69 is provided on the lower surface 57A of the insulating layer 57 to cover the wirings 65 to 67.

The via 72 is provided to pass through a portion of the insulating layer 69 arranged on the lower surface side of the wiring 65. An upper end portion of the via 72 is connected to the wiring 65. The via 73 is provided to pass through a portion of the insulating layer 69 arranged on the lower surface side of the wiring 66. An upper end portion of the via 73 is connected to the wiring 66. The via 74 is provided to pass through a portion of the insulating layer 69 arranged on the lower surface side of the wiring 67. An upper end portion of the via 74 is connected to the wiring 67.

The wirings 76 to 78 are provided on a lower surface 69A of the insulating layer 69. The wiring 76 is connected to a lower end portion of the via 72. The wiring 77 is connected to a lower end portion of the via 73. The wiring 78 is connected to a lower end portion of the via 74.

The solder resist 81 is provided on the lower surface 69A of the insulating layer 69 to cover a part of the wirings 76 to 78. The solder resist 81 has an opening portion 81A for exposing a part of the lower surface of the wiring 76, an opening portion 81B for exposing a part of the lower surface of the wiring 77, and an opening portion 81C for exposing a part of the lower surface of the wiring 78. Respective portions of the wirings 76 to 78 exposed from the opening portions 81A to 81C function as external connection pads of the optical/electrical hybrid substrate 10.

Figure 9:
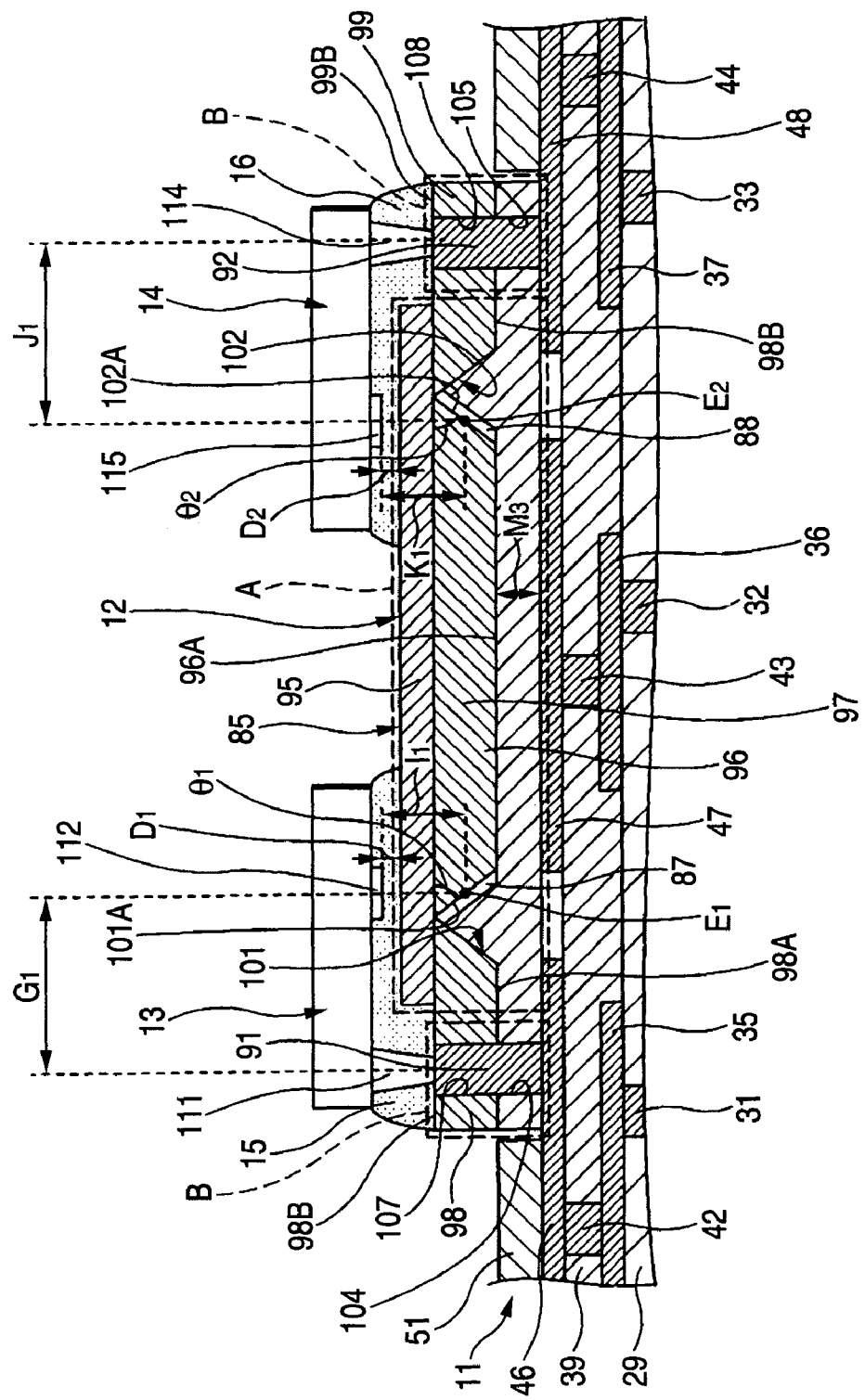
FIG. 9 is a sectional view showing the optical/electrical hybrid substrate shown in FIG. 8 in an enlarged manner.
Figure 12:
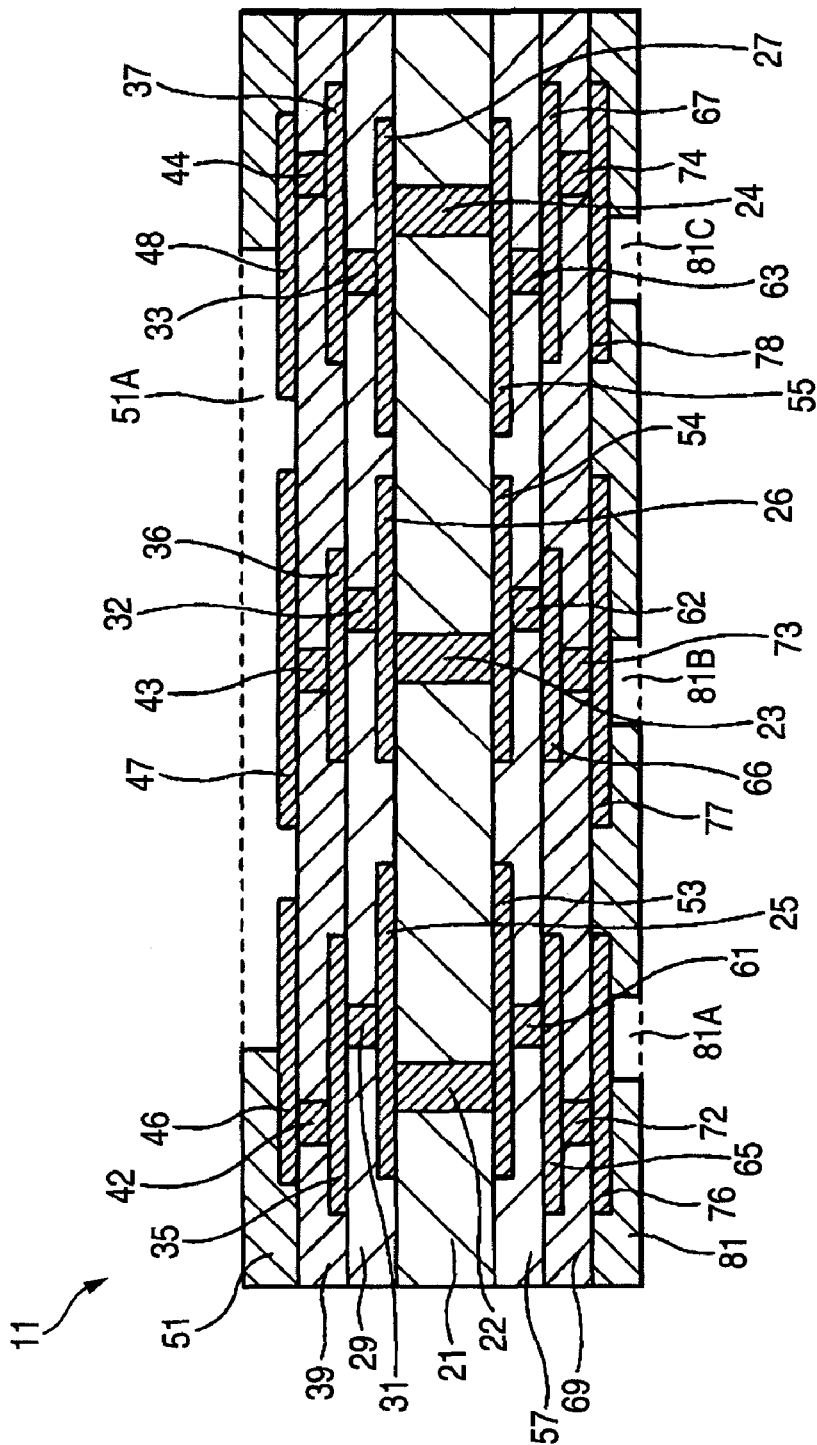
FIG. 12 is a view (#1) showing steps of manufacturing the optical/electrical hybrid substrate according to the first embodiment of the present invention.
Figure 13:
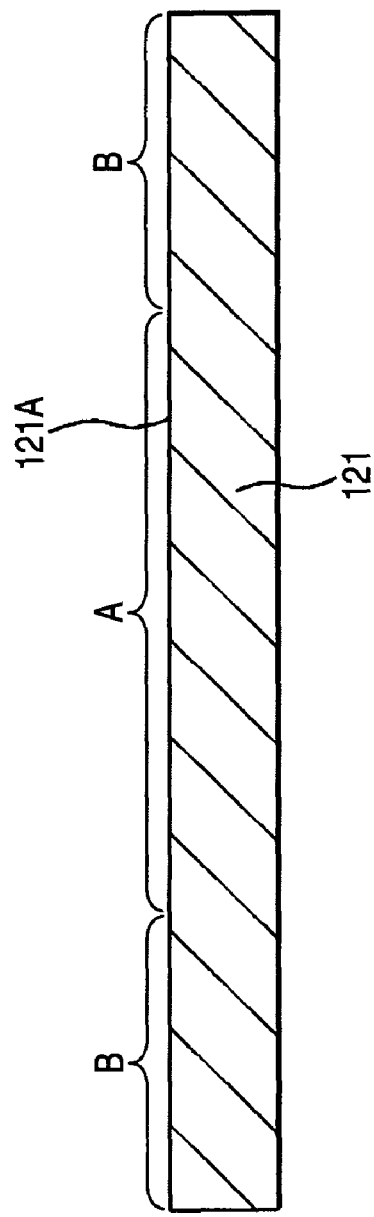
FIG. 13 is a view (#2) showing steps of manufacturing the optical/electrical hybrid substrate according to the first embodiment of the present invention.

FIG. 9 is a sectional view showing the optical/electrical hybrid substrate shown in FIG. 8 in an enlarged manner, FIG. 10 is a plan view showing the optical waveguide shown in FIG. 9, and FIG. 11 is a sectional view showing the optical waveguide taken along a C-C line and shown in FIG. 10.

By reference to FIG. 9 to FIG. 11, the optical waveguide 12 is bonded to portions of the wirings 46 to 48 exposed from the opening portion 51A, and has an optical waveguide main body 85, mirrors 87, 88, and through vias 91, 92. The optical waveguide main body 85 has a first region A in which a core portion 96 and the mirrors 87, 88 are arranged to transmit the light signal and a second region B which is arranged on both sides of the first region A not to contribute to the transmission of the light signal, and has a first cladding layer 95, the core portion 96, a second cladding layer 97, and core members 98, 99.

A portion of the optical waveguide main body 85 corresponding to the first region A is constructed by stacking the first cladding layer 95, the core portion 96, and the second cladding layer 97. A portion of the optical waveguide main body 85 corresponding to the second region B arranged on one side of the first region A is constructed by stacking the core member 98 whose thickness is substantially equal to the core portion 96, and the second cladding layer 97. A portion of the optical waveguide main body 85, in which the core member 98 is provided, in the second region B is the area in which the through via 91 connected to a terminal 111 of the light emitting element 13 is provided.

A portion of the optical waveguide main body 85 corresponding to the second region B arranged on the other side of the first region A is constructed by stacking the core member 99 whose thickness is substantially equal to the core portion 96, and the second cladding layer 97. A portion of the optical waveguide main body 85, in which the core member 99 is provided, in the second region B is the area in which the through via 92 connected to a terminal 114 of the light receiving element 14 is provided.

The first cladding layer 95 is provided to cover only a surface 96A of the core portion 96 and a surface 97A of a portion of the second cladding layer 97 provided in the first region A. A portion of the optical waveguide main body 85 in the first region A on the side that faces the light emitting element 13 and the light receiving element 14 is protruded larger than a portion of the optical waveguide main body 85 in the second region B in which the through via 91 to which the terminal 111 of the light emitting element 13 is connected and the through via 92 to which the terminal 114 of the light receiving element 14 is connected are provided.

In this manner, the portion of the optical waveguide main body 85 in the first region A on the side that faces to the light emitting element 13 and the light receiving element 14 is formed to protrude larger than the portion of the optical waveguide main body 85 in the second region B on the side that faces to the light emitting element 13 and the light receiving element 14. Therefore, a light emitting portion 112 of the light emitting element 13 (described later) can be arranged in vicinity of the mirror 87 and a light receiving portion 115 of the light receiving element 14 (described later) can be arranged in vicinity of the mirror 88 (in other words, the light emitting portion 112 and the light receiving portion 115 can be arranged in vicinity of the first cladding layer 95).

Accordingly, a divergence of the light signal between the light emitting element 13 and the light receiving element 14 and the optical waveguide 12 can be suppressed. Therefore, a transmission loss of the light signal between the light emitting element 13 and the optical waveguide 12 and a transmission loss of the light signal between the light receiving element 14 and the optical waveguide 12 can be reduced. A distance $D_1$ between the light emitting portion 112 of the light emitting element 13 and the first cladding layer 95 may be set to 5 μm, for example. A distance $D_2$ between the light receiving portion 115 of the light receiving element 14 and the first cladding layer 95 may be set to 5 μm, for example. A thickness $M_1$ of the first cladding layer 95 may be set to 15 μm, for example.

The core portion 96 is provided in plural between the first cladding layer 95 and the portion of the second cladding layer 97 arranged in the first region A. The core portions 96 are provided to transmit the light signal and arranged in the first region A. Each of the core portions 96 has recess portions 101, 102. The recess portion 101 is formed in a portion of the core portion 96 arranged under the light emitting element 13. The recess portion 101 has an inclined surface 101A to which the mirror 87 is provided. The inclined surface 101A is a surface whose angle $\theta_1$ with respect to the surface 96A of the core portion 96 is set to 45 degree.

The recess portion 102 is formed on a portion of the core portion 96 arranged under the light receiving element 14. The recess portion 102 has an inclined surface 102A to which the mirror 88 is provided. The inclined surface 102A is a surface whose angle $\theta_2$ with respect to the surface 96A of the core portion 96 is set to 45 degree. The core portion 96 is constructed by the core material whose refractive index is larger than the first and second cladding layers 95, 97. A thickness $M_2$ of the core portion 82 may be set to 35 μm, for example. Also, an alignment pitch of the core portions 96 may be set to 250 μm, for example.

The second cladding layer 97 is bonded to the wirings 46 to 48 exposed from the opening portion 51A with a conductive adhesive agent (not shown). The second cladding layer 97 is provided to fill the recess portions 101, 102 formed in the core portion 96 and cover the surface 96A of the core portion 96 and surfaces 98A, 99A of the core members 98, 99. The second cladding layer 97 has through holes 104, 105 as second through holes. The through hole 104 is formed to pass through the portion of the second cladding layer 97 corresponding to the area where the core member 98 is provided. A diameter of the through hole 104 may be set to 70 μm, for example. The through hole 105 is formed to pass through the portion of the second cladding layer 97 corresponding to the area where the core member 99 is provided. A diameter of the through hole 105 may be set to 70 μm, for example. A thickness $M_3$ of the second cladding layer 97 may be set to 15 μm, for example.

The core member 98 is provided on a portion of the second cladding layer 97 in the second region B arranged under the light emitting element 13. The core member 98 is the same material as the core material used in forming the core portion 96, and has a thickness that is substantially equal to the thickness $M_2$ of the core portion 96. The core member 98 has a through hole 107 as the first through hole. The through hole 107 is formed to pass through a portion of the core member 98 opposing to the through hole 104. A diameter of the through hole 107 may be set to 70 μm, for example.

The core member 99 is provided on a portion of the second cladding layer 97 in the second region B arranged under the light receiving element 14. The core member 99 is the same material as the core member used in forming the core portion 96, and has a thickness that is substantially equal to the thickness $M_2$ of the core portion 96. The core member 99 has a through hole 108 as the first through hole. The through hole 108 is formed to pass through a portion of the core member 99 opposing to the through hole 105. A diameter of the through hole 108 may be set to 70 μm, for example.

The mirror 87 is provided to a portion of the core portion 96 in the inclined surface 101A. The mirror 87 is provided to reflect the light signal emitted from the light emitting element 13 to the core portion 96. As the mirror 87, for example, an Al film (whose thickness is 0.2 μm, for example) may be used.

The mirror 88 is provided to a portion of the core portion 96 in the inclined surface 102A. The mirror 88 is provided to reflect the light signal to the light receiving element 14. As the mirror 88, for example, an Al film (whose thickness is 0.2 μm, for example) may be used.

The through via 91 is provided in the through holes 104, 107 formed in the optical waveguide main body 85. The terminal 111 of the light emitting element 13 is connected to an upper end portion of the through via 91, and a lower end portion of the through via 91 is connected electrically to the wiring 46. The through via 91 is provided to connect electrically the light emitting element 13 and the wiring 46.

In this manner, since the through via 91 to which the terminal 111 of the light emitting element 13 is connected is provided in the optical waveguide main body 85, a difference between an actual distance $G_1$ from a center position $E_1$ (a center position of an optical axis) of the mirror 87 provided to the core portion 96 to a center position of the through via 91 and an optimum distance G from the center position $E_1$ (the center position of the optical axis) of the mirror 87 to a center position of the through via 91 and a difference between an actual distance $I_1$ from the light emitting portion 112 of the light emitting element 13 to the center position $E_1$ of the mirror 87 and an optimum distance I from the light emitting portion 112 to the center position $E_1$ of the mirror 87 can be reduced. Therefore, a transmission loss of the light signal between the light emitting element 13 and the optical waveguide 12 can be reduced. The optimum distance G may be set to 155 μm, for example. Also, the optimum distance I may be set to 32.5 μm, for example.

An upper end surface of the through via 91 is substantially in the same plane as a surface 98B of the core member 98. A lower end surface of the through via 91 is substantially in the same plane as the lower surface of the second cladding layer 97. In other words, both end surface of the through via 91 are substantially in the same plane as portions of both surfaces of the optical waveguide main body 85 in the second region B.

In this manner, both end surface of the through via 91 are substantially in the same plane as portions of both surfaces of the optical waveguide main body 85 in the second region B. Therefore, reliability of the connection can be improved when the terminal 111 of the light emitting element 13 is connected to the through via 91.

The through via 92 is provided in the through holes 105, 108 formed in the optical waveguide main body 85. The terminal 114 of the light receiving element 14 is connected to an upper end portion of the through via 92, and a lower end portion of the through via 92 is connected electrically to the wiring 48. The through via 92 is provided to connect electrically the light receiving element 14 and the wiring 48.

In this manner, since the through via 92 to which the terminal 114 of the light receiving element 14 is connected is provided in the optical waveguide main body 85, a difference between an actual distance $J_1$ from a center position $E_2$ (a center position of an optical axis) of the mirror 88 provided to the core portion 96 to a center position of the through via 92 and an optimum distance J from the center position $E_2$ (the center position of the optical axis) of the mirror 88 to a center position of the through via 92 and a difference between an actual distance $K_1$ from the light receiving portion 115 of the light receiving element 14 to the center position $E_2$ of the mirror 88 and an optimum distance K from the light receiving portion 115 to the center position $E_2$ of the mirror 88 can be reduced. Therefore, a transmission loss of the light signal between the light receiving element 14 and the optical waveguide 12 can be reduced. The optimum distance J may be set to 155 μm, for example. Also, the optimum distance K may be set to 32.5 μm, for example.

An upper end surface of the through via 92 is substantially in the same plane as a surface 99B of the core member 99. A lower end surface of the through via 92 is substantially in the same plane as the lower surface of the second cladding layer 97. In other words, both end surface of the through via 92 are substantially in the same plane as portions of both surfaces of the optical waveguide main body 85 in the second region B.

In this manner, both end surface of the through via 92 are substantially in the same plane as portions of both surfaces of the optical waveguide main body 85 in the second region B. Therefore, reliability of the connection can be improved when the terminal 114 of the light receiving element 14 is connected to the through via 92.

The light emitting element 13 is arranged on a portion of the optical waveguide 12 corresponding to forming positions of the mirror 87 and the through via 91. The light emitting element 13 has the terminal 111 and the light emitting portion 112 for emitting the light signal. The terminal 111 is fixed to the via 91 by the solder (not shown). The light emitting portion 112 is arranged over the mirror 87 to oppose to the center position $E_1$ (the center position of the optical axis) of the mirror 87. As the light emitting element 13, the vertical cavity surface emitting laser (VCSEL), for example, may be employed.

The light receiving element 14 is arranged on a portion of the optical waveguide 12 corresponding to forming positions of the mirror 88 and the through via 92. The light receiving element 14 has the terminal 114 and the light receiving portion 115 for receiving the light signal. The terminal 114 is fixed to the via 92 by the solder (not shown). The light receiving portion 115 is arranged over the mirror 88 to oppose to the center position 2 (the center position of the optical axis) of the mirror 88. As the light receiving element 14, the photodiode (PD), for example, may be employed.

The underfill resin 15 is provided to fill a clearance between the light emitting element 13 and the optical waveguide 12. The underfill resin 16 is provided to fill a clearance between the light receiving element 14 and the optical waveguide 12. As the underfill resins 15, 16, a translucent resin capable of transmitting the light signal may be employed.

According to the optical/electrical hybrid substrate of the present embodiment, the through via 91 connected to the terminal 111 of the light emitting element 13 and the through via 92 connected to the terminal 114 of the light receiving element 14 are provided to the portion of the optical waveguide main body 85 corresponding to the second regions B arranged on both sides of the first region A. Also, in the first region A the core portion 96 and the mirrors 87, 88 are arranged and the light signal is transmitted. Therefore, a relative positional displacement of the actual alignment positions of the light emitting element 13 and the light receiving element 14 from their optimum alignment positions can be reduced as compared with the case where the light emitting element 13 and the light receiving element 14 are mounted on the wiring substrate 11. As a result, a transmission loss of the light signal between the light emitting element 13 and the optical waveguide 12 and a transmission loss of the light signal between the light receiving element 14 and the optical waveguide 12 can be reduced.

Also, the portion of the optical waveguide main body 85 in the first region A on the side that faces to the light emitting element 13 and the light receiving element 14 is protruded larger than the portion of the optical waveguide main body 85 in the second region B on the side that faces to the light emitting element 13 and the light receiving element 14. Therefore, the light emitting portion 112 of the light emitting element 13 can be arranged in vicinity of the mirror 87 and the light receiving portion 115 of the light receiving element 14 can be arranged in vicinity of the mirror 88. As a result, a transmission loss of the light signal between the light emitting element 13 and the optical waveguide 12 and a transmission loss of the light signal between the light receiving element 14 and the optical waveguide 12 can be reduced.

Figure 15:
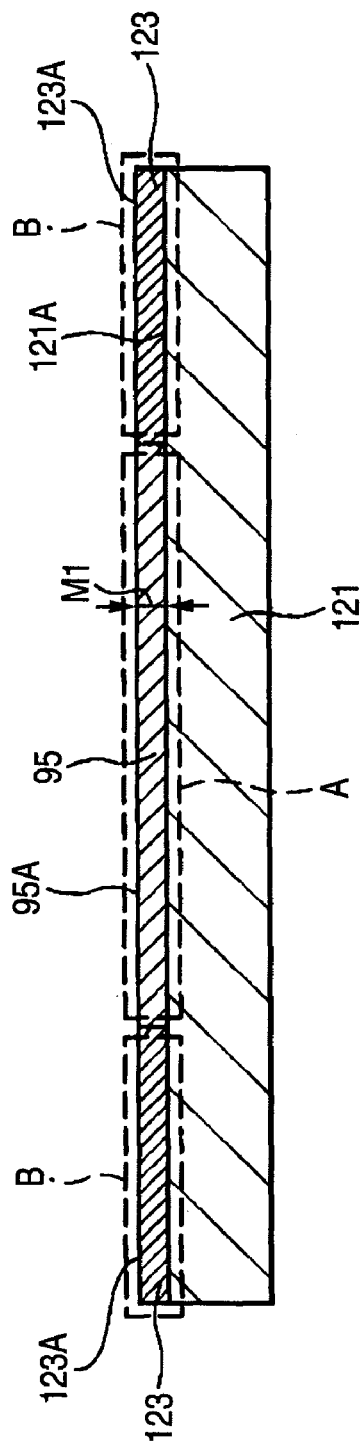
FIG. 15 is a view (#4) showing steps of manufacturing the optical/electrical hybrid substrate according to the first embodiment of the present invention.
Figure 16:
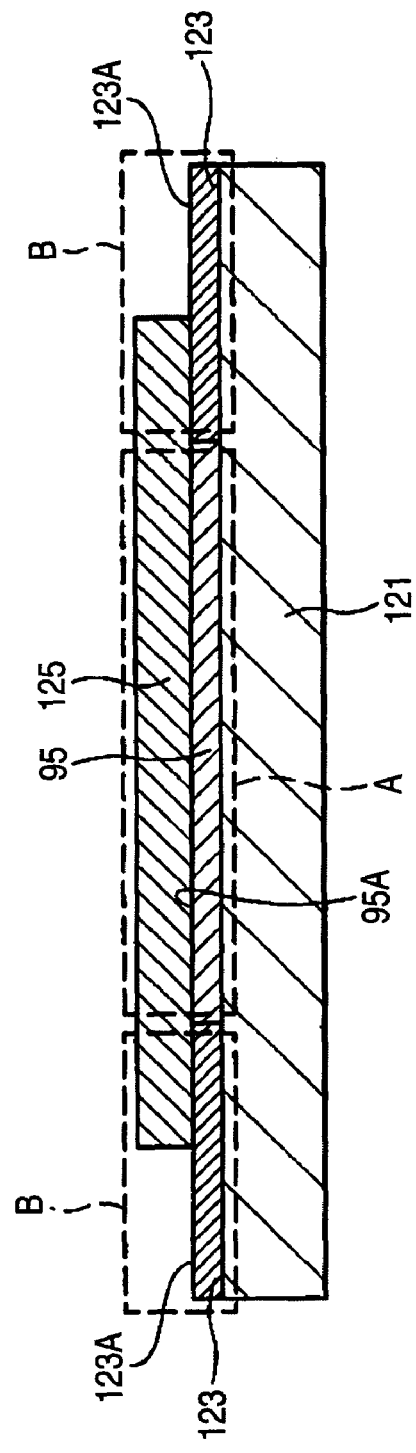
FIG. 16 is a view (#5) showing steps of manufacturing the optical/electrical hybrid substrate according to the first embodiment of the present invention.
Figure 17:
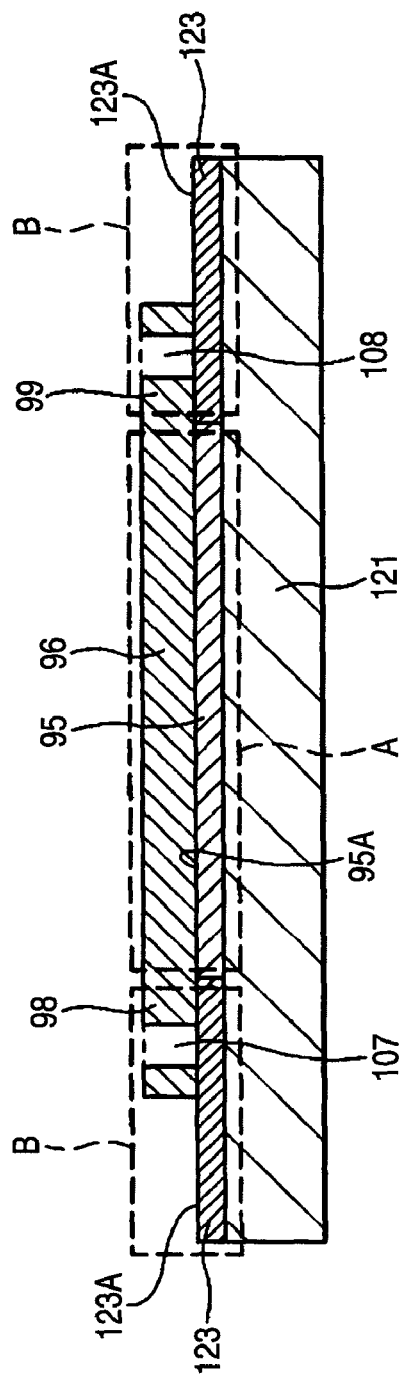
FIG. 17 is a view (#6) showing steps of manufacturing the optical/electrical hybrid substrate according to the first embodiment of the present invention.
Figure 24:
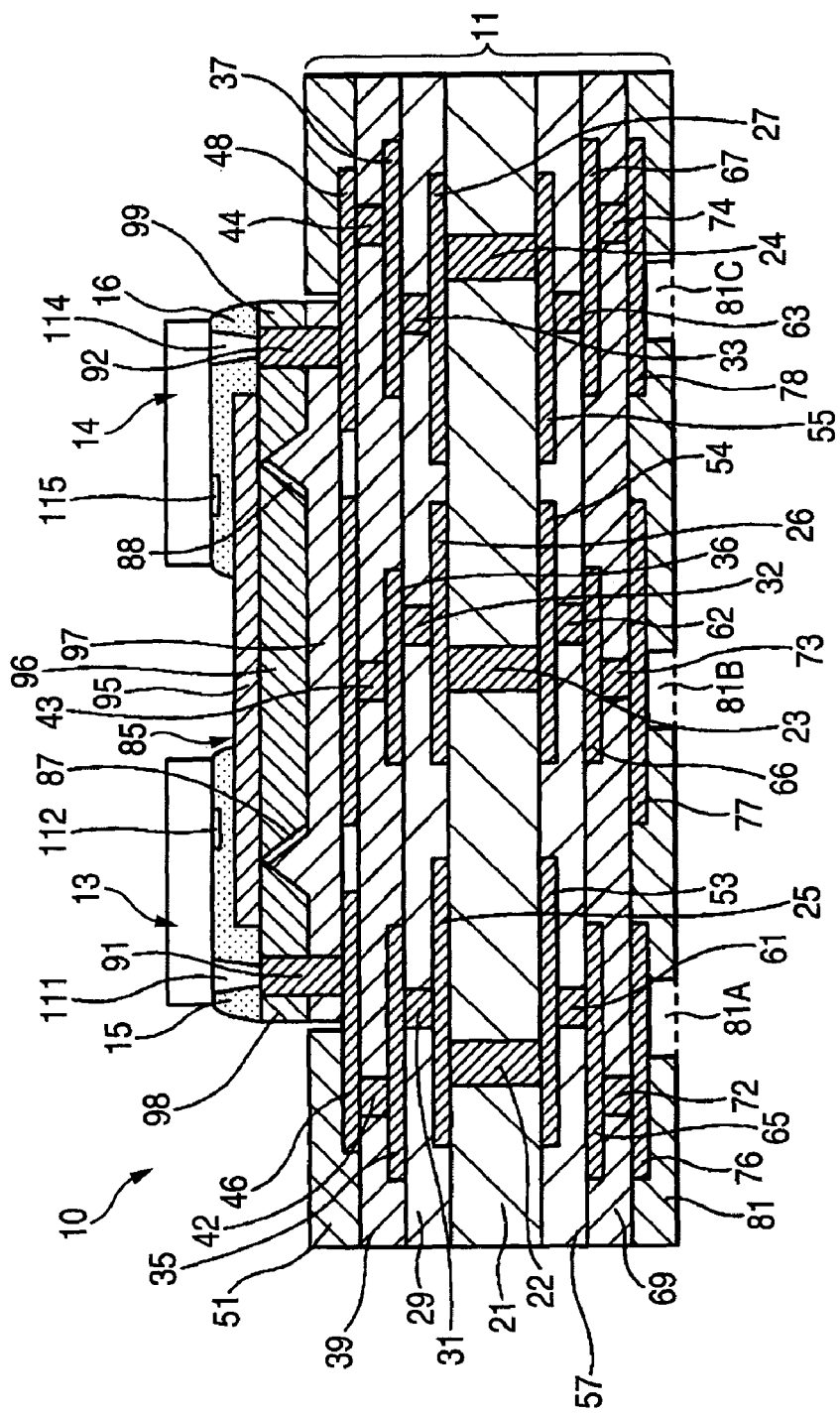
FIG. 24 is a view (#13) showing steps of manufacturing the optical/electrical hybrid substrate according to the first embodiment of the present invention.
Figure 25:
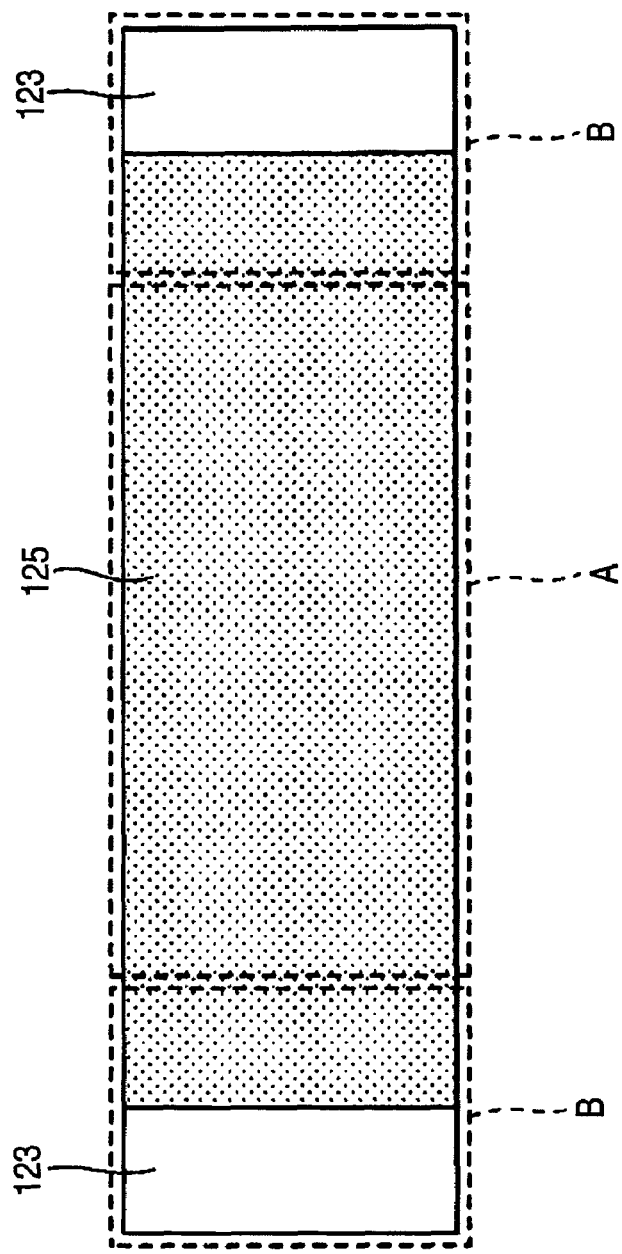
FIG. 25 is a plan view showing the structure shown in FIG. 16.
Figure 26:
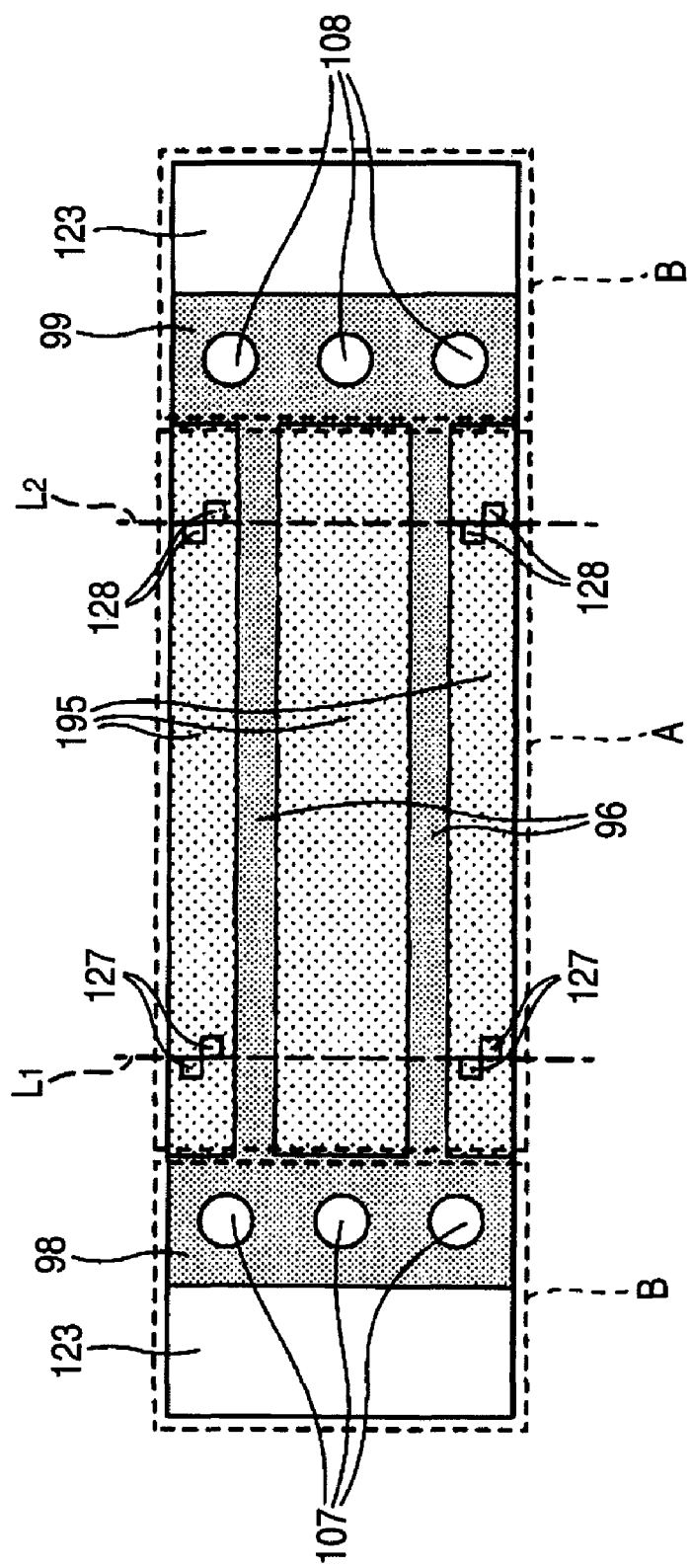
FIG. 26 is a plan view showing the structure shown in FIG. 17.

FIG. 12 to FIG. 24 are views showing steps of manufacturing the optical/electrical hybrid substrate according to the first embodiment of the present invention, FIG. 25 is a plan view showing the structure shown in FIG. 16, and FIG. 26 is a plan view showing the structure shown in FIG. 17. In FIG. 12 to FIG. 26, the same reference symbols are affixed to the same constituent portions as those of the optical/electrical hybrid substrate 10 according to the first embodiment. Also, in FIG. 26, $L_1$, $L_2$ denote a position in which the dicing blade cuts the core portion 96 respectively (referred to as "cut positions $L_1$, $L_2$" hereinafter)

By reference to FIG. 12 to FIG. 26, a method of manufacturing the optical/electrical hybrid substrate 10 according to the first embodiment will be described hereunder. At first, in steps shown in FIG. 12, the wiring substrate 11 is formed by the well-known approach. Then, in steps shown in FIG. 13, a metal plate 121 is prepared which has the first region A in which the core portion 96 and the mirrors 87, 88 are formed and the second region B arranged on both sides of the first region A. The metal plate 121 is a supporting substrate in forming the optical waveguide 12. As the metal plate 121, for example, a Cu plate may be employed.

In this manner, the metal plate 121 is employed as the supporting substrate used in forming the optical waveguide 12. Therefore, the unnecessary metal plate 121 can be removed by the etching process (concretely, the wet etching process, for example) in steps shown in FIG. 21 described later.

Figure 14:
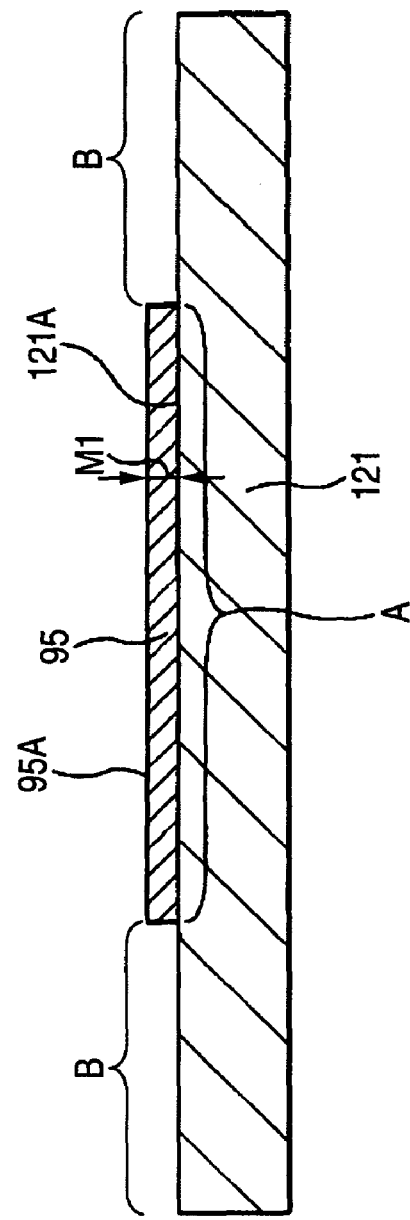
FIG. 14 is a view (#3) showing steps of manufacturing the optical/electrical hybrid substrate according to the first embodiment of the present invention.

Then, in steps shown in FIG. 14, the first cladding layer 95 is formed on an upper surface 121A of the portion of the metal plate 121 in the first region A (first cladding layer forming step). Concretely, the first cladding layer 95 is formed by pasting a sheet-like cladding material and exposing/developing the cladding material. A thickness $M_1$ of the first cladding layer 95 may be set to 15 μm, for example.

Then, in steps shown in FIG. 15, a metal film 123 is formed on a portion of the upper surface 121A of the metal plate 121 in the second region B, by the electroplating method using the metal plate 121 as a power feeding layer (metal film forming step). At this time, the metal film 123 is formed such that an upper surface 123A of the metal film 123 is substantially in the same plane as a surface 95A of the first cladding layer 95 (such that a thickness of the metal film 123 is substantially equal to a thickness $M_1$ of the first cladding layer 95).

Then, in steps shown in FIG. 16, a core material 125 is formed to cover the surface 95A of the first cladding layer 95 and a part of the upper surface 123A of the metal film 123, as shown in FIG. 25 (core material forming step). The core member 125 constitutes the core portion 96 and the core materials 98, 99 when patterned in steps shown in FIG. 17 (described later). A thickness of the core material 125 may be set to 35 μm, for example.

Then, in steps shown in FIG. 17, the core portion 96, alignment marks 127, 128 used in forming the inclined surfaces 101A, 102A on the core portion 96, the through hole 107 in the core member 98, and the through hole 108 in the core member 99 are formed simultaneously, as shown in FIG. 26, by patterning the core material 125 shown in FIG. 16 (core portion forming step). The patterning of the core material 125 is performed by applying the exposure and development process to the core material 125. The alignment marks 127, 128 are formed on a portion of the surface 95A, which is arranged in the first region A, of the first cladding layer 95. A thickness $M_2$ of the core portion 96 may be set to 35 μm, for example. A diameter of the through holes 107, 108 may be set to 70 μm, for example.

In this manner, in the core portion forming step applied to form the core portion 96, the core portion 96 and the alignment marks 127, 128 used in forming the inclined surfaces 101A, 102A on the core portion 96 are formed simultaneously. Therefore, a production cost of the optical waveguide 12 can be reduced as compared with the case where the core portion 96 and the alignment marks 127, 128 are formed separately.

Figure 18:
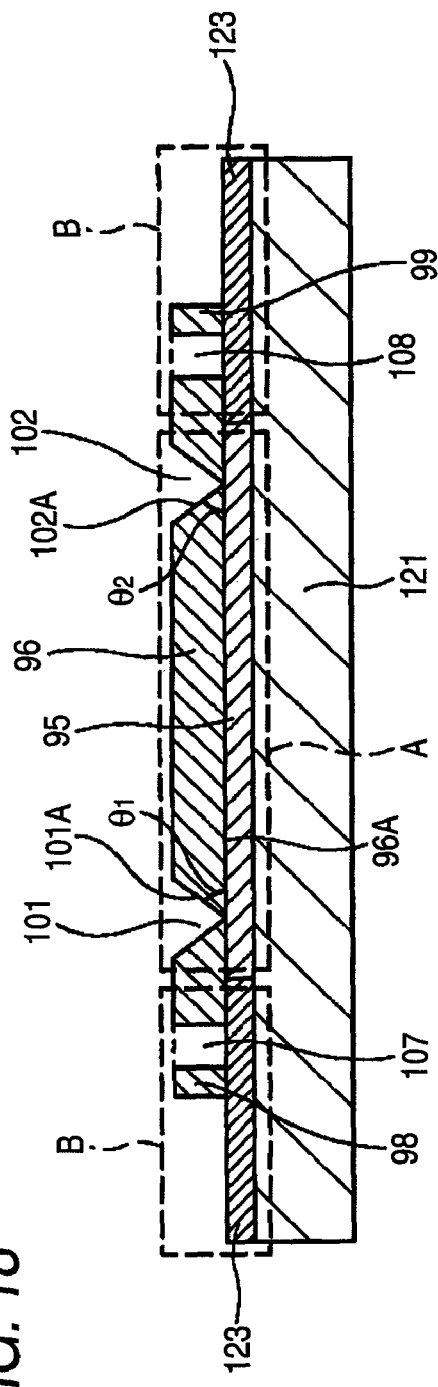
FIG. 18 is a view (#7) showing steps of manufacturing the optical/electrical hybrid substrate according to the first embodiment of the present invention.

Then, in steps shown in FIG. 18, the recess portions 101, 102 formed as a V-shape are formed on a plurality of core portions 96 by cutting the cut positions $L_1$, $L_2$ obtained based on the alignment marks 127, 128 by means of the dicing blade. Thus, the inclined surfaces 101A, 102A are formed on a plurality of core portions 96 (inclined surface forming step). The inclined surfaces 101A, 102A are formed such that the angles $\theta_1$, $\theta_2$ with respect to the surface 96A of the core portion 96 are set to 45 degree respectively.

In this manner, the inclined surfaces 101A, 102A are formed on the core portions 96 by cutting a plurality of core portions 96 based on the alignment marks 127, 128 by means of the dicing blade. Therefore, the inclined surfaces 101A, 102A can be formed in given positions with good precision. As a result, a positional precision of the inclined surfaces 101A, 102A on which the mirrors 87, 88 are formed can be improved, and thus a transmission loss of the light signal between the light emitting element 13 and the optical waveguide 12 and a transmission loss of the light signal between the light receiving element 14 and the optical waveguide 12 can be reduced.

Figure 19:
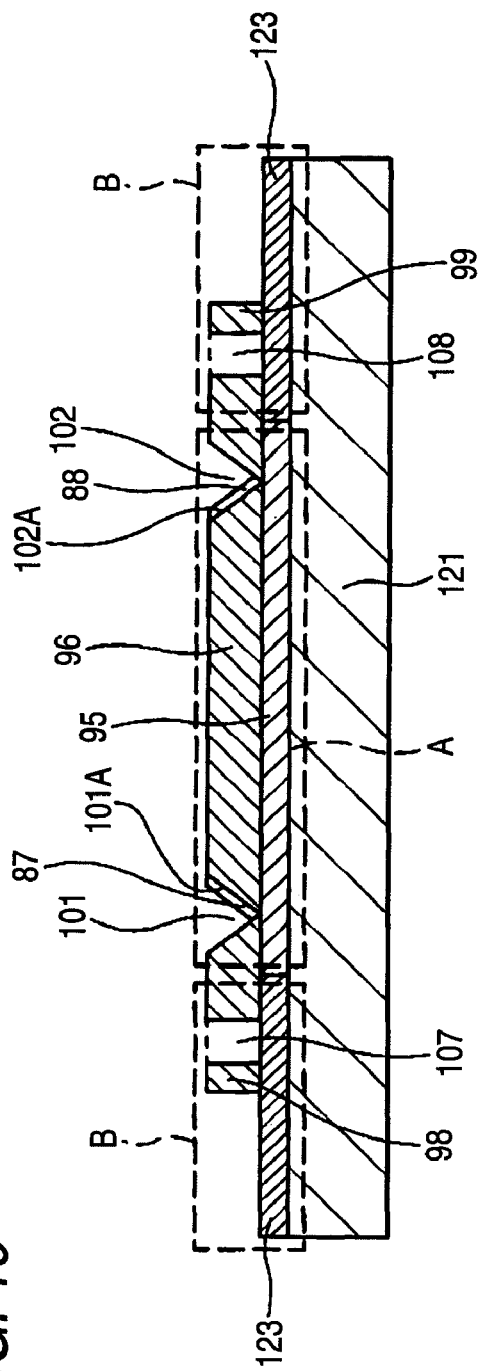
FIG. 19 is a view (#8) showing steps of manufacturing the optical/electrical hybrid substrate according to the first embodiment of the present invention.

Then, in steps shown in FIG. 19, the mirror 87 is formed on the inclined surface 101A of the core portion 96, and the mirror 88 is formed on the inclined surface 102A of the core portion 96 (mirror forming step). Concretely, the mirrors 87, 88 are formed by forming an Al film (whose thickness is 0.2 μm, for example) on the inclined surfaces 101A, 102A.

Figure 20:
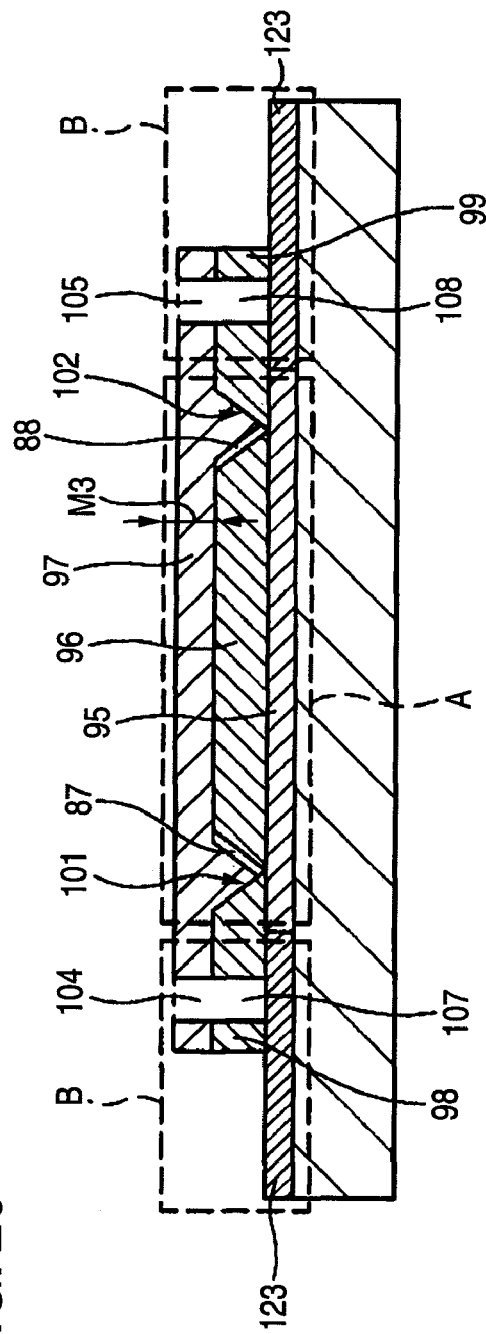
FIG. 20 is a view (#9) showing steps of manufacturing the optical/electrical hybrid substrate according to the first embodiment of the present invention.

Then, in steps shown in FIG. 20, the second cladding layer 97 having the through hole 104 opposing to the through hole 107 and the through hole 105 opposing to the through hole 108 are formed to cover the first cladding layer 95, the core portion 96, the core members 98, 99, and the alignment marks 127, 128 (second cladding layer forming step). A thickness $M_3$ of the second cladding layer 97 may be set to 15 μm, for example. Also, a diameter of the through holes 104, 105 may be set to 70 μm, for example.

Figure 21:
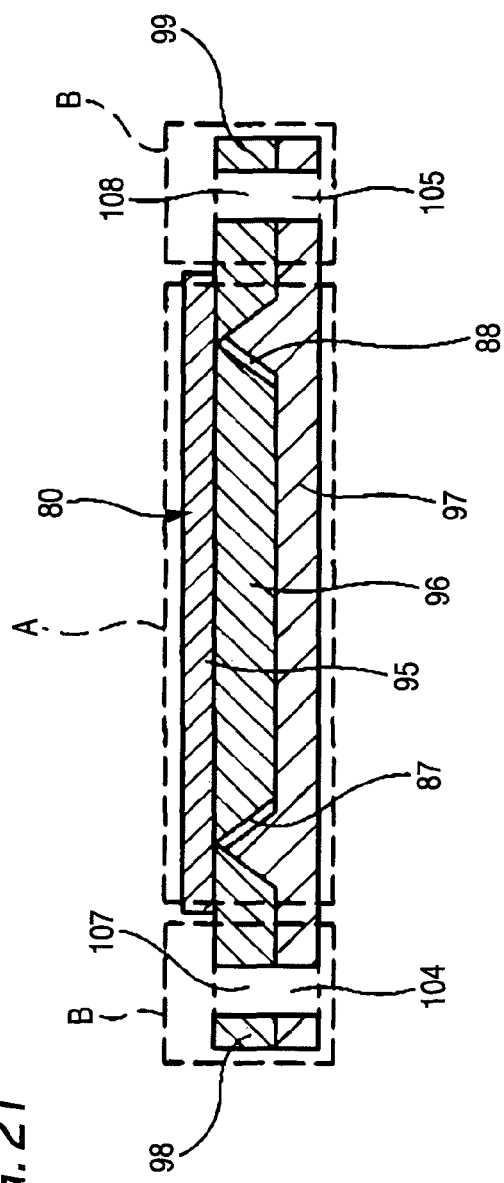
FIG. 21 is a view (#10) showing steps of manufacturing the optical/electrical hybrid substrate according to the first embodiment of the present invention.

Then, in steps shown in FIG. 21, the metal plate 121 and the metal film 123 are removed by the etching process (metal plate and metal film removing step). Thus, the optical waveguide main body 85 is formed. The metal plate 121 and the metal film 123 can be removed by the wet etching, for example.

Figure 22:
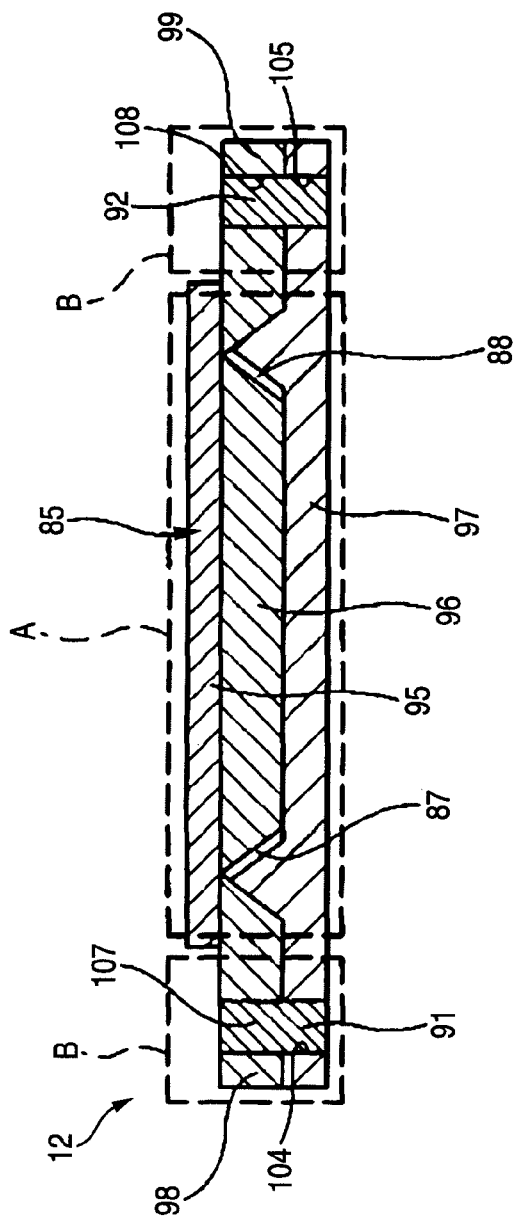
FIG. 22 is a view (#11) showing steps of manufacturing the optical/electrical hybrid substrate according to the first embodiment of the present invention.

Then, in steps shown in FIG. 22, the through via 91 is formed in the through holes 104, 107 and also the through via 92 is formed in the through holes 105, 108 (through via forming step). Thus, the optical waveguide 12 is formed.

Figure 23:
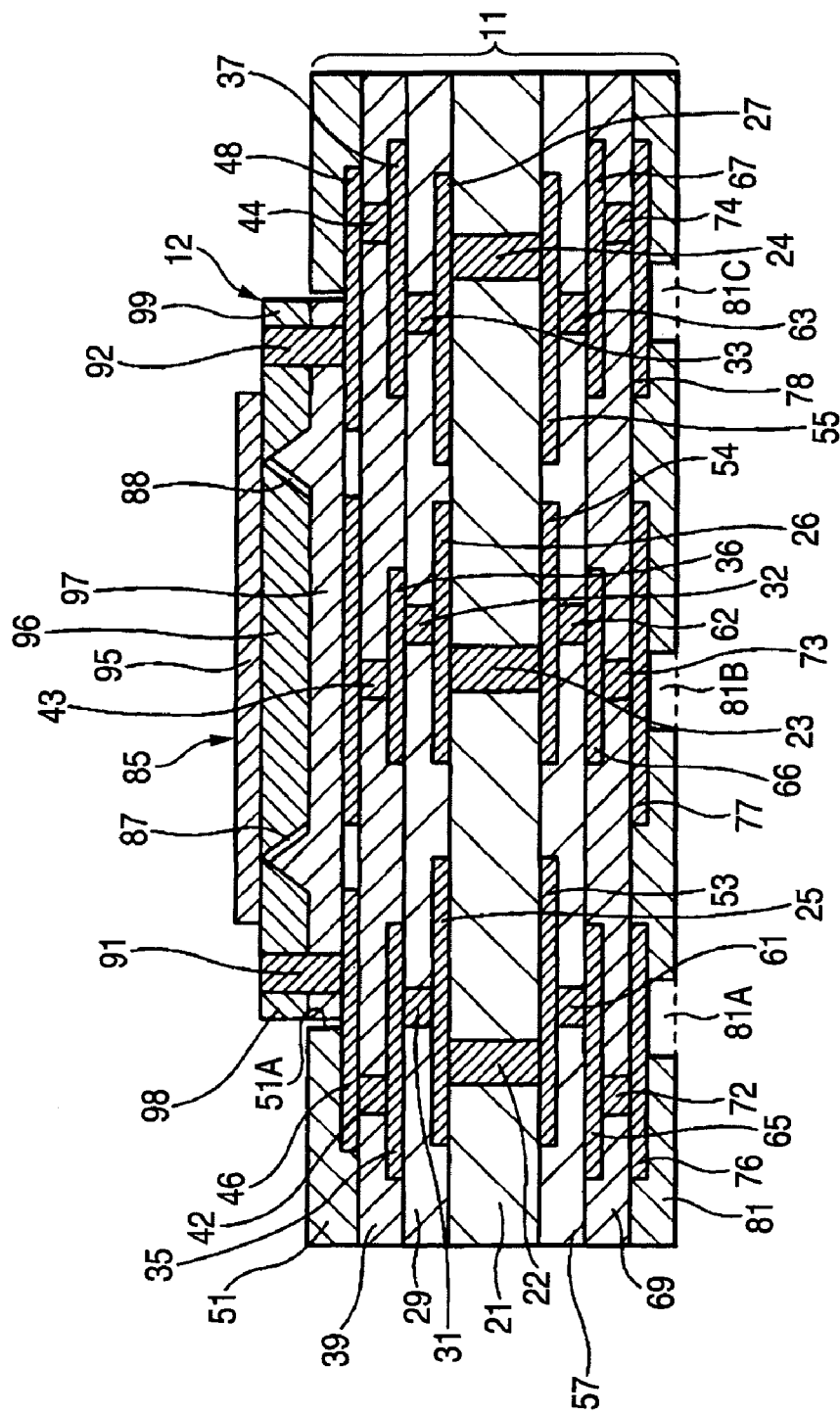
FIG. 23 is a view (#12) showing steps of manufacturing the optical/electrical hybrid substrate according to the first embodiment of the present invention.

Then, in steps shown in FIG. 23, the optical waveguide 12 is bonded onto portions of the wirings 46 to 48 exposed from the opening portion 51A in the solder resist 51. As an adhesive agent used in bonding the optical waveguide 12, for example, a conductive adhesive agent can be employed.

Then, in steps shown in FIG. 24, the terminal 111 of the light emitting element 13 is fixed onto the through via 91 by a solder (not shown), and also the underfill resin 15 is formed to fill a clearance between the light emitting element 13 and the optical waveguide 12. Then, the terminal 114 of the light receiving element 14 is fixed onto the through via 92 by a solder (not shown), and also the underfill resin 16 is formed to fill a clearance between the light receiving element 14 and the optical waveguide 12. Thus, the optical/electrical hybrid substrate 10 according to the first embodiment is manufactured. As the underfill resins 15, 16, for example, a light transmitting resin may be employed.

According to the method of manufacturing the optical waveguide of the present embodiment, in the core portion forming step applied to form the core portion 96, the core portion 96 and the alignment marks 127, 128 used in forming the inclined surfaces 101A, 102A on the core portion 96 are simultaneously formed. Therefore, a production cost of the optical waveguide 12 can be reduced as compared with the case where the core portion 96 and the alignment marks 127, 128 are formed separately.

Also, the inclined surfaces 101A, 102A are formed on the core portions 96 by cutting a plurality of core portions 96 based on the alignment marks 127, 128 by means of the dicing blade. Therefore, the inclined surfaces 101A, 102A can be formed in given positions with good precision. As a result, a positional precision of the inclined surfaces 101A, 102A on which the mirrors 87, 88 are formed can be improved, and thus a transmission loss of the light signal between the light emitting element 13 and the optical waveguide 12 and a transmission loss of the light signal between the light receiving element 14 and the optical waveguide 12 can be reduced.

Second Embodiment

Figure 27:
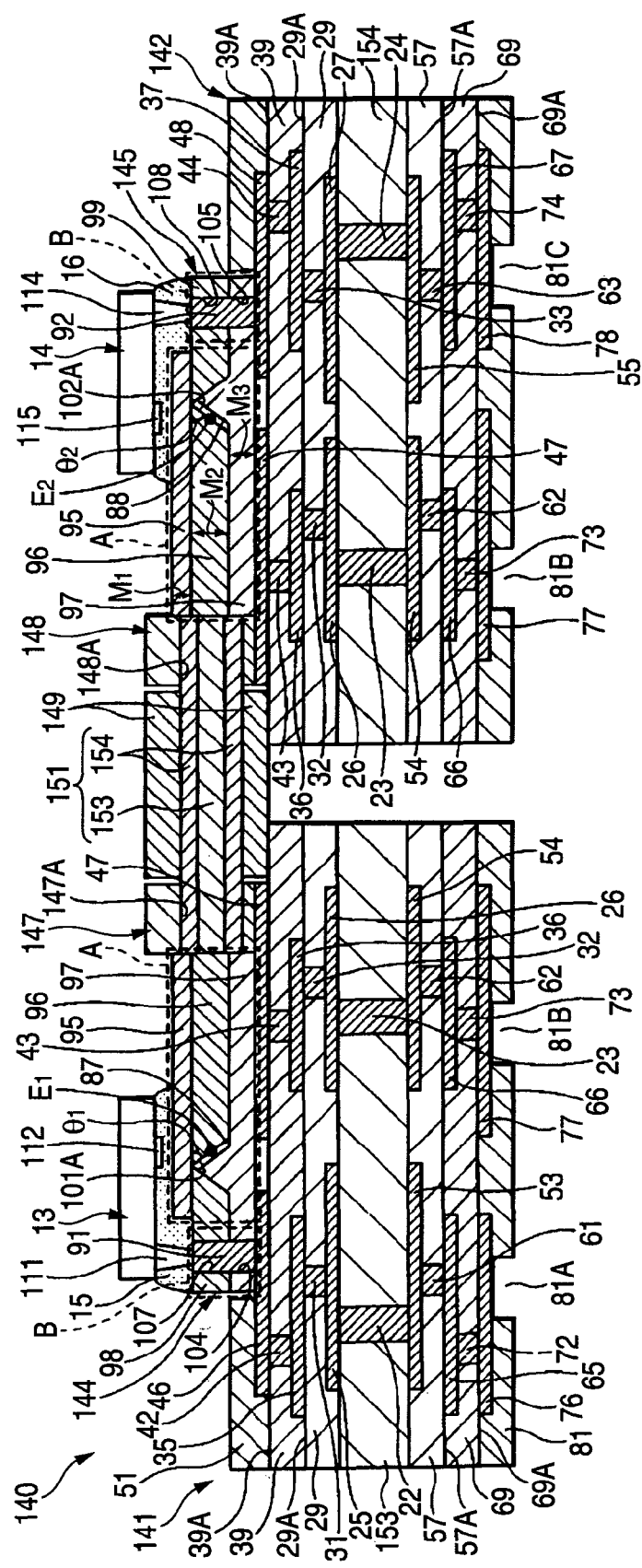
FIG. 27 is a sectional view showing an optical/electrical hybrid substrate according to a second embodiment of the present invention.

FIG. 27 is a sectional view showing an optical/electrical hybrid substrate according to a second embodiment of the present invention. In FIG. 27, the same reference symbols are affixed to the same constituent portions as those of the optical/electrical hybrid substrate 10 according to the first embodiment.

By reference to FIG. 27, an optical/electrical hybrid substrate 140 of the second embodiment includes wiring substrates 141, 142, optical waveguides 144, 145, first connectors 147, 148, a second connector 149, a plurality of optical fibers 151, the light emitting element 13, the light receiving element 14, the underfill resins 15, 16.

The wiring substrate 141 is constructed by providing the through vias 22, 23, the wirings 25, 26, 35, 36, 46, 47, 53, 54, 65, 66, 76, 77, the vias 31, 32, 42, 43, 61, 62, 72, 73, the insulating layers 29, 39, 57, 69, and the solder resists 51, 81 (here, the opening portions 51A, 81C are excluded from the structure), all described in the first embodiment, to a substrate main body 153 formed like a plate.

The wiring substrate 142 is constructed by providing the through vias 23, 24, the wirings 26, 27, 36, 37, 47, 48, 54, 55, 66, 67, 77, 78, the vias 32, 33, 43, 44, 62, 63, 73, 74, the insulating layers 29, 39, 57, 69, and the solder resists 51, 81 (here, the opening portions 51A, 81A are excluded from the structure), all described in the first embodiment, to a substrate main body 154 formed like a plate.

The optical waveguide 144 is bonded onto the wirings 46, 47 of the wiring substrate 141. The optical waveguide 144 has the first cladding layer 95, the core portions 96, the second cladding layer 97, the core member 98, the mirror 87, and the through via 91. The optical waveguide 144 is constructed to have a structure similar to the portion of the structure, which is positioned on the left side from a center position of the optical waveguide 12 described in the first embodiment and shown in FIG. 22.

The optical waveguide 145 is bonded onto the wirings 47, 48 of the wiring substrate 142. The optical waveguide 145 has the first cladding layer 95, the core portions 96, the second cladding layer 97, the core member 99, the mirror 88, and the through via 92. The optical waveguide 145 is constructed to have a structure similar to the portion of the structure, which is positioned on the right side from a center position of the optical waveguide 12 described in the first embodiment and shown in FIG. 22.

The first connector 147 is bonded onto the wiring 47 of the wiring substrate 141. The first connector 147 has insertion portions 147A into which top end portions of the optical fibers 151 are inserted. The first connector 148 is bonded onto the wiring 48 of the wiring substrate 142. The first connector 148 has insertion portions 148A into which top end portions of the optical fibers 151 are inserted. The first connectors 147, 148 are the connectors to which end portions of the second connector 149 and the optical fibers 151 are fitted.

The second connector 149 is the connector to restrict positions of a plurality of optical fibers 151 in a state that both end portions of the plurality of optical fibers 151 are exposed.

A plurality of optical fibers 151 are fixed by the second connector 149 in a state that both end portions are exposed. Out of both end portions of the plurality of optical fibers 151, one end portions are inserted into the insertion portions 147A of the first connector 147 whereas the other end portions are inserted into the insertion portions 148A of the first connector 148. Each of the plurality of optical fibers 151 has a core portion 153 for transmitting the light signal, and a cladding portion 154 provided to cover the periphery of the core portion 153. The plurality of optical fibers 151 are used to transmit the light signal fed via the optical waveguide 144 to the optical waveguide 145.

The light emitting element 13 is arranged on the portions of the optical waveguide 144 corresponding to the forming positions of the mirror 87 and the through via 91. The terminal 111 of the light emitting element 13 is fixed onto the through via 91 by a solder (not shown). The light emitting portion 112 of the light emitting element 13 is arranged over the mirror 87 to oppose to the center position $E_1$ (the center position on the optical axis) of the mirror 87.

The light receiving element 14 is arranged on the portions of the optical waveguide 145 corresponding to the forming positions of the mirror 88 and the through via 92. The terminal 114 of the light receiving element 14 is fixed onto the through via 92 by a solder (not shown). The light receiving portion 115 of the light receiving element 14 is arranged over the mirror 88 to oppose to the center position $E_2$ (the center position on the optical axis) of the mirror 88.

The underfill resin 15 is provided to fill a clearance between the light emitting element 13 and the optical waveguide 144. The underfill resin 16 is provided to fill a clearance between the light receiving element 14 and the optical waveguide 145.

The optical/electrical hybrid substrate 140 constructed as above can achieve the similar advantages to those of the optical/electrical hybrid substrate 10 according to the first embodiment. Also, the optical waveguides 144, 145 described above can be formed by the similar approach to that applied to the optical waveguide 12 described in the first embodiment.

Third Embodiment

Figure 28:
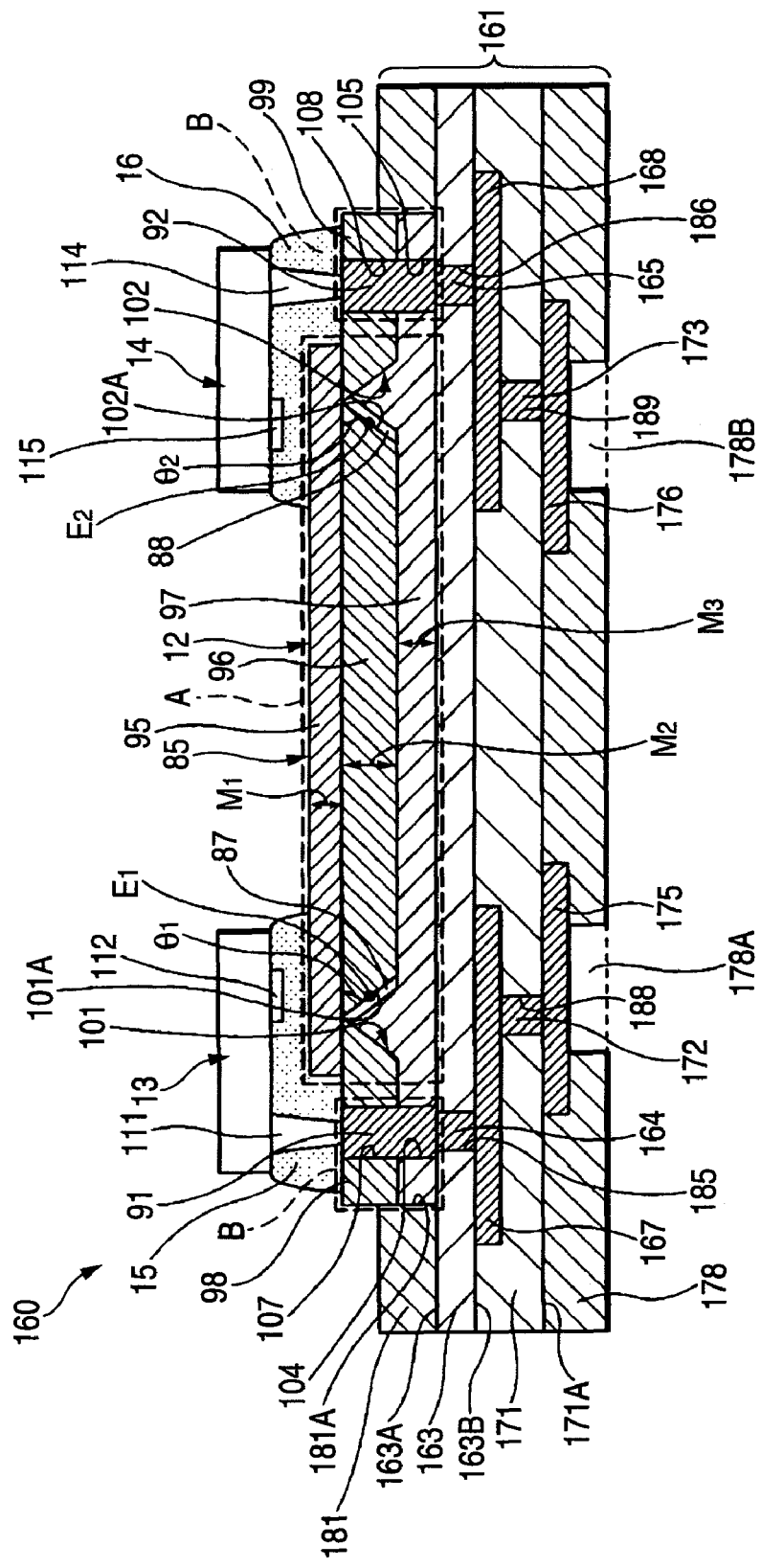
FIG. 28 is a sectional view showing an optical/electrical hybrid substrate according to a third embodiment of the present invention.
Figure 29:
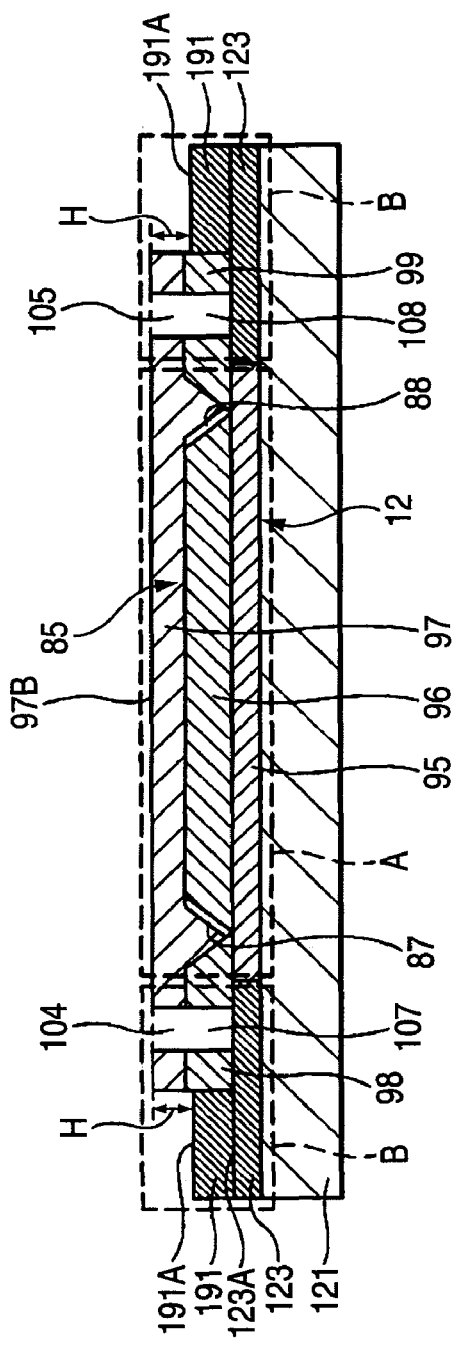
FIG. 29 is a view (#1) showing steps of manufacturing the optical/electrical hybrid substrate according to the third embodiment of the present invention.

FIG. 28 is a sectional view showing an optical/electrical hybrid substrate according to a third embodiment of the present invention. In FIG. 28, the same reference symbols are affixed to the same constituent portions as those of the optical/electrical hybrid substrate 10 according to the first embodiment.

By reference to FIG. 28, an optical/electrical hybrid substrate 160 of the third embodiment is constructed to have the structure similar to that of the optical/electrical hybrid substrate 10, except that a built-up structure 161 is provided instead of the wiring substrate 11 provided to the optical/electrical hybrid substrate 10 of the first embodiment.

The built-up structure 161 has insulating layers 163, 171, vias 164, 165, 172, 173, wirings 167, 168, 175, 176, and solder resists 178, 181.

The insulating layer 163 has opening portion 185, 186. The opening portion 185 is formed to pass through a portion of the insulating layer 163, which opposes to the through via 91 provided to the optical waveguide 12. The opening portion 186 is formed to pass through a portion of the insulating layer 163, which opposes to the through via 92 provided to the optical waveguide 12.

The via 164 is provided in the opening portion 185. An upper end portion of the via 164 is connected electrically to the through via 91 and a lower end portion is connected to the wiring 167. The via 165 is provided in the opening portion 186. An upper end portion of the via 165 is connected electrically to the through via 92 and a lower end portion is connected to the wiring 168. As the material of the vias 164, 165, for example, Cu may be employed.

The wiring 167 is provided on a surface 163B of a portion of the insulating layer 163 corresponding to a forming position of the via 164. The wiring 168 is provided on the surface 163B of a portion of the insulating layer 163 corresponding to a forming position of the via 165. The material of the wirings 167, 168, for example, Cu may be employed.

The insulating layer 171 is provided on the surface 163B of the insulating layer 163 to cover a part of the wirings 167, 168. The insulating layer 171 has an opening portion 188 for exposing a part of the wiring 167, and an opening portion 189 for exposing a part of the wiring 168.

The via 172 is provided in the opening portion 188. An upper end portion of the via 172 is connected electrically to the wiring 167 and a lower end portion is connected to the wiring 175. The via 173 is provided in the opening portion 189. An upper end portion of the via 173 is connected electrically to the wiring 168 and a lower end portion is connected to the wiring 176. As the material of the vias 172, 173, for example, Cu may be employed.

The wiring 175 is provided on a surface 171A of a portion of the insulating layer 171 corresponding to a forming position of the via 172. The wiring 176 is provided on the surface 171A of a portion of the insulating layer 171 corresponding to a forming position of the via 173. The material of the wirings 175, 176, for example, Cu may be employed.

The solder resist 178 is provided on the surface 171A of the insulating layer 171 to cover a part of the wirings 175, 176. The solder resist 178 has an opening portion 178A for exposing a part of the wiring 175, and an opening portion 178B for exposing a part of the wiring 176.

The solder resist 181 is provided on the surface 163A of the insulating layer 163. The solder resist 181 has the surface 163A of a portion of the insulating layer 163 corresponding to a provision area of the optical waveguide 12, and an opening portion 181A for exposing upper surfaces of the vias 164, 165.

The optical waveguide 12 is provided on a portion of the surface 163A of the insulating layer 163 exposed from the opening portion 181A. The through via 91 provided in the optical waveguide 12 is connected electrically to the via 164. The through via 92 provided in the optical waveguide 12 is connected electrically to the via 165.

The light emitting element 13 is arranged on a portion of the optical waveguide 12 corresponding to forming positions of the mirror 87 and the through via 91. The terminal 111 of the light emitting element 13 is fixed onto the through via 91 by the solder (not shown). The light emitting portion 112 of the light emitting element 13 is arranged over the mirror 88 to oppose to the center position $E_1$ (the center position on the optical axis) of the mirror 87.

The light receiving element 14 is arranged on the portions of the optical waveguide 12 corresponding to the forming positions of the mirror 88 and the through via 92. The terminal 114 of the light receiving element 14 is fixed onto the through via 92 by the solder (not shown). The light receiving portion 115 of the light receiving element 14 is arranged over the mirror 88 to oppose to the center position $E_2$ (the center position on the optical axis) of the mirror 88.

The underfill resin 15 is provided to fill the clearance between the light emitting element 13 and the optical waveguide 12. The underfill resin 16 is provided to fill a clearance between the light receiving element 14 and the optical waveguide 12.

The optical/electrical hybrid substrate 160 constructed as above can achieve the similar advantages to the optical/electrical hybrid substrate 10 of the first embodiment.

FIG. 29 to FIG. 37 are views showing steps of manufacturing the optical/electrical hybrid substrate according to the third embodiment of the present invention. In FIG. 29 to FIG. 37, the same reference symbols are affixed to the same constituent portions as those of the optical/electrical hybrid substrate 160 according to the second embodiment.

By reference to FIG. 29 to FIG. 37, a method of manufacturing the optical/electrical hybrid substrate according to the third embodiment will be described hereunder.

At first, the structure shown in FIG. 20 is formed by applying the similar processes to the steps shown in FIG. 13 to FIG. 20 described in the first embodiment. Then, in steps shown in FIG. 29, a metal film 191 is formed on the upper surface 123A of the metal film 123 by the electroplating process using the metal film 123 as a power feed layer. At this time, the metal film 191 is formed such that a difference H of height between an upper surface 191A of the metal film 191 and a surface 97B of the second cladding layer 97 becomes substantially equal to the solder resist 181. As the metal film 191, for example, a Cu film may be employed.

Figure 30:
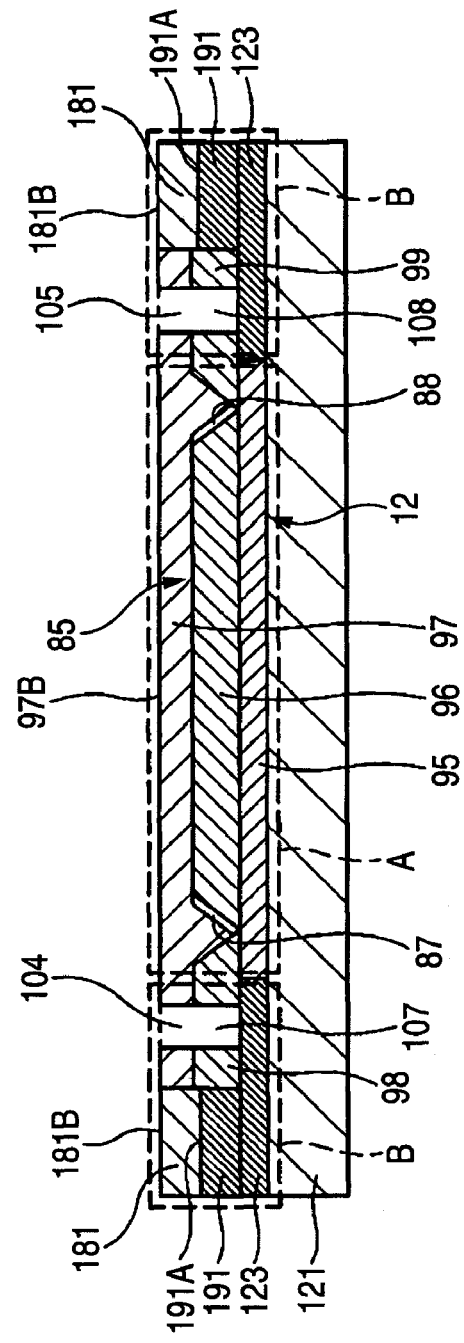
FIG. 30 is a view (#2) showing steps of manufacturing the optical/electrical hybrid substrate according to the third embodiment of the present invention.

Then, in steps shown in FIG. 30, the solder resist 181 is formed on the surface 191A of the metal film 191. At this time, the solder resist 181 is formed such that the surface 97B of the second cladding layer 97 is substantially in the same plane as the surface 181B of the solder resist 181.

Figure 31:
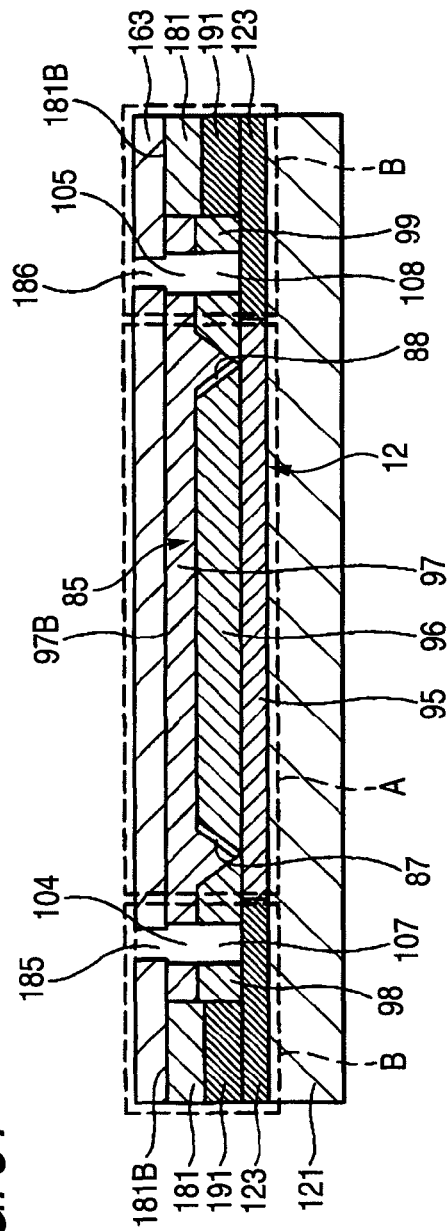
FIG. 31 is a view (#3) showing steps of manufacturing the optical/electrical hybrid substrate according to the third embodiment of the present invention.

Then, in steps shown in FIG. 31, the insulating layer 163 having the opening portions 185, 186 is formed on the structure shown in FIG. 30. At this time, the opening portion 185 is formed in a portion of the insulating layer 163 opposing to the opening portion 104, and the opening portion 186 is formed in a portion of the insulating layer 163 opposing to the opening portion 105.

Figure 32:
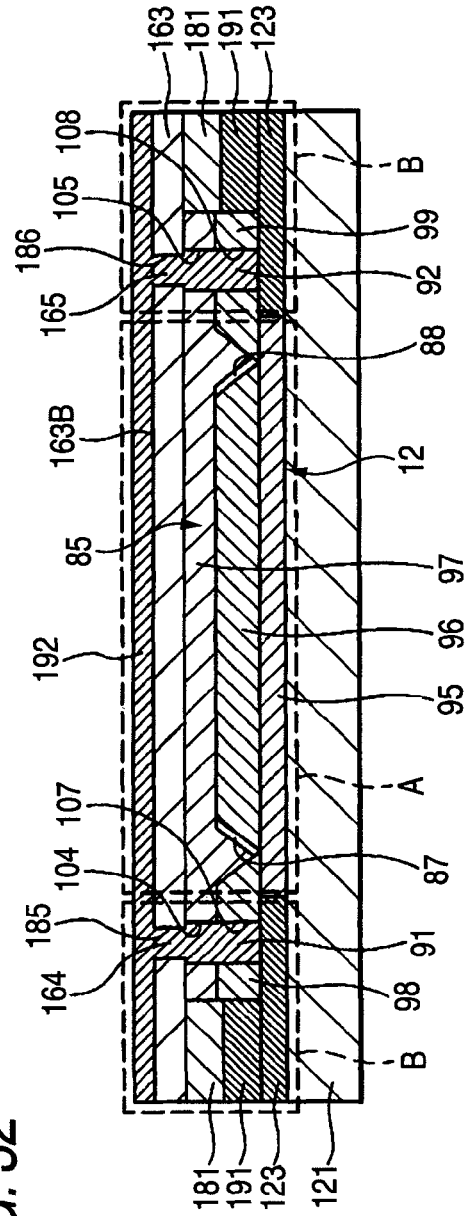
FIG. 32 is a view (#4) showing steps of manufacturing the optical/electrical hybrid substrate according to the third embodiment of the present invention.

Then, in steps shown in FIG. 32, according to the electroplating process using the metal film 123 as a power feeding layer, opening portions 104, 105, 107, 108, 185, 186 are filled and also a metal film 192 is deposited/grown to cover the surface 163B of the insulating layer 163 (through via forming step and a part of built-up structure forming steps). Thus, the through vias 91, 92 and the vias 164, 165 are formed and also the optical waveguide 12 having the through vias 91, 92 is manufactured. As the metal film 192, for example, a Cu film may be employed.

In this manner, in forming the built-up structure 161, the through vias 91, 92 provided to the optical waveguide 12 are formed. Thus, the number of manufacturing steps can be reduced, and thus a production cost of the optical/electrical hybrid substrate 160 can be reduced. In this case, the through vias 91, 92 and the vias 164, 165 may be formed separately.

Figure 33:
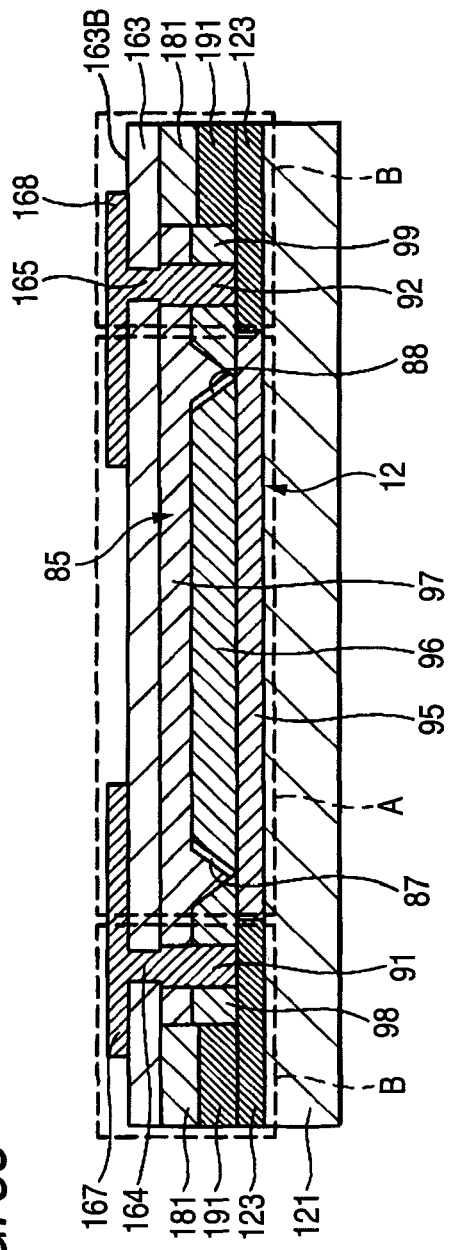
FIG. 33 is a view (#5) showing steps of manufacturing the optical/electrical hybrid substrate according to the third embodiment of the present invention.

Then, in steps shown in FIG. 33, the wirings 167, 168 are formed by patterning the metal film 192 shown in FIG. 32. That is, in the present embodiment, elements of the built-up structure 161 are directly formed on the optical waveguide 12.

Figure 34:
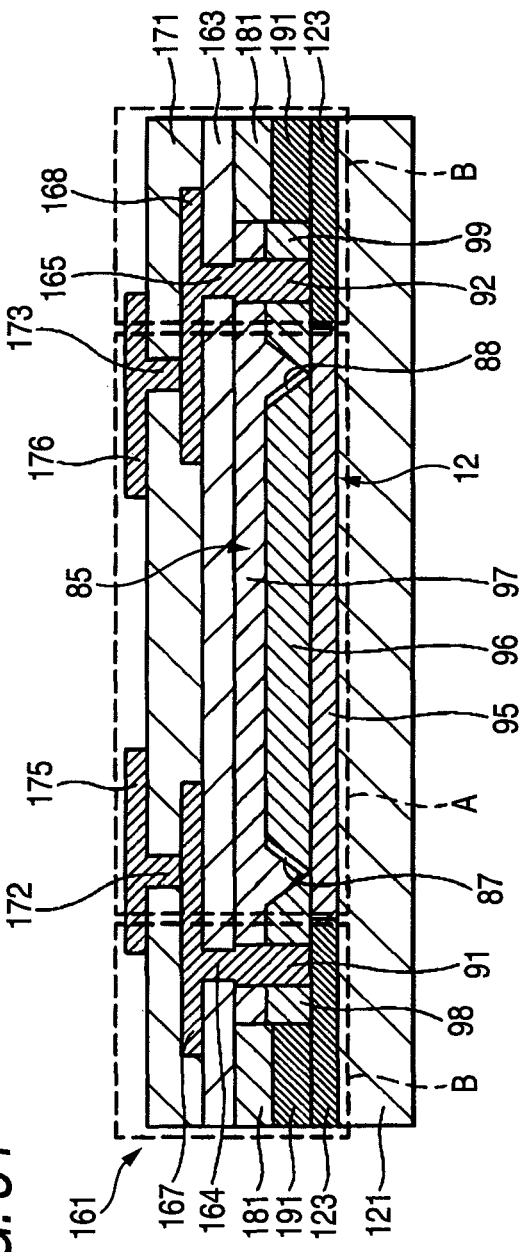
FIG. 34 is a view (#6) showing steps of manufacturing the optical/electrical hybrid substrate according to the third embodiment of the present invention.

Then, in steps shown in FIG. 34, the insulating layer 171, the vias 122, 173, and the wirings 175, 176 are formed on the structure shown in FIG. 33 by applying the similar processes to the steps shown in FIG. 31 to FIG. 33.

Figure 35:
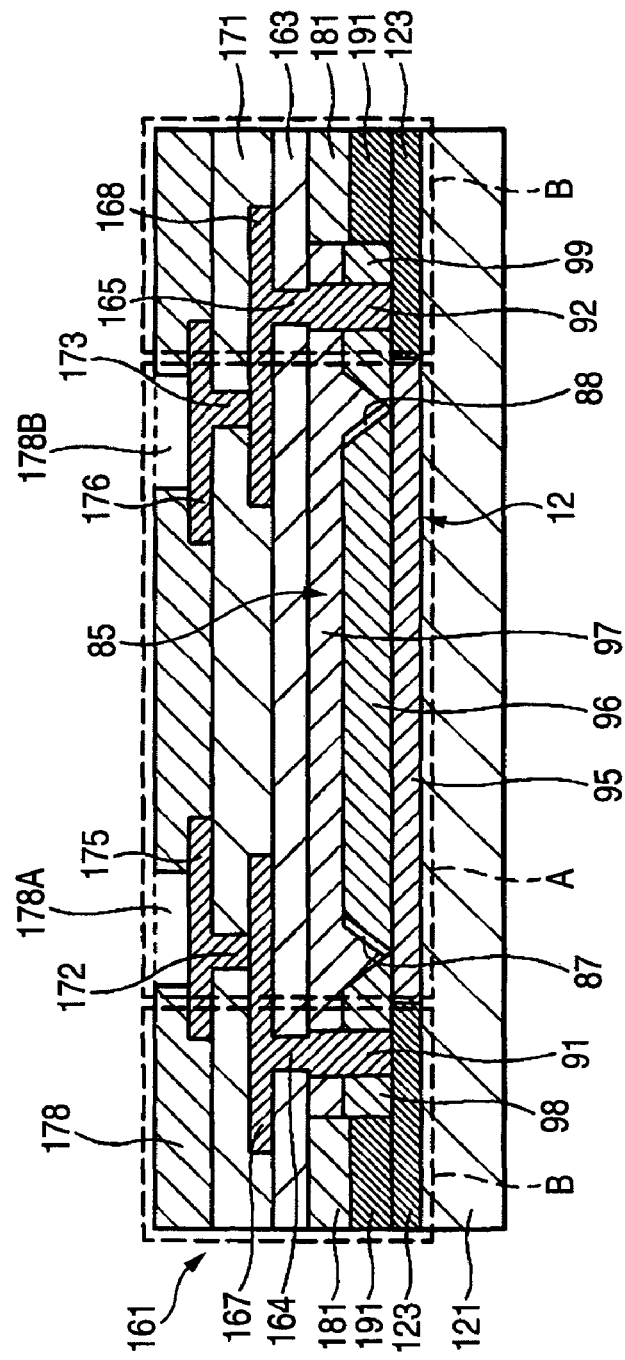
FIG. 35 is a view (#7) showing steps of manufacturing the optical/electrical hybrid substrate according to the third embodiment of the present invention.

Then, in steps shown in FIG. 35, the solder resist 178 having the opening portions 178A, 178B is formed on the structure shown in FIG. 34. Thus, the built-up structure 161 formed integrally with the optical waveguide 12 is manufactured on the metal plate 121. The steps described above and shown in FIG. 30 to FIG. 35 are the steps corresponding to the built-up structure forming steps.

Figure 36:
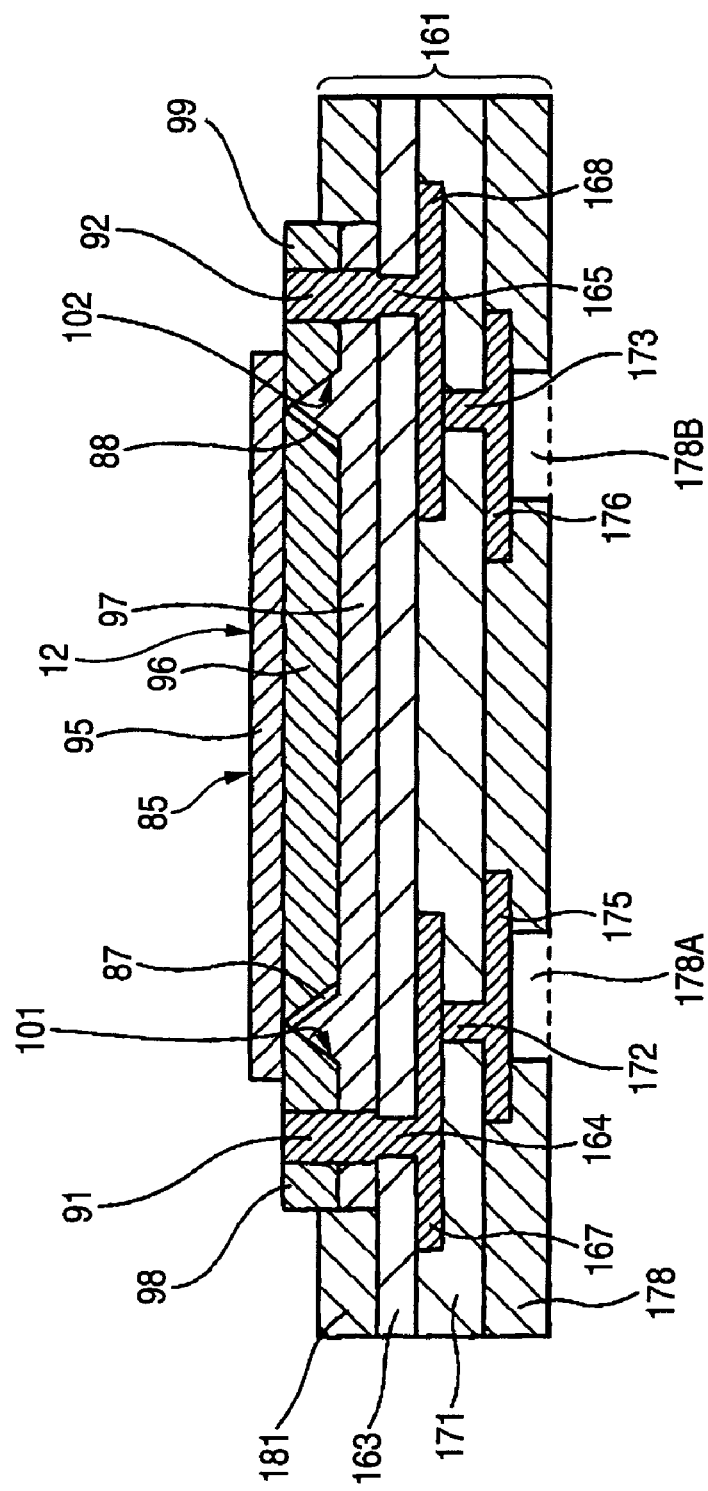
FIG. 36 is a view (#8) showing steps of manufacturing the optical/electrical hybrid substrate according to the third embodiment of the present invention.

Then, in steps shown in FIG. 36, the metal plate 121 and the metal films 123, 191 are removed by the etching process (metal plate and metal film removing step). Concretely, for example, the metal plate 121 and the metal films 123, 191 are removed by the wet etching.

Figure 37:
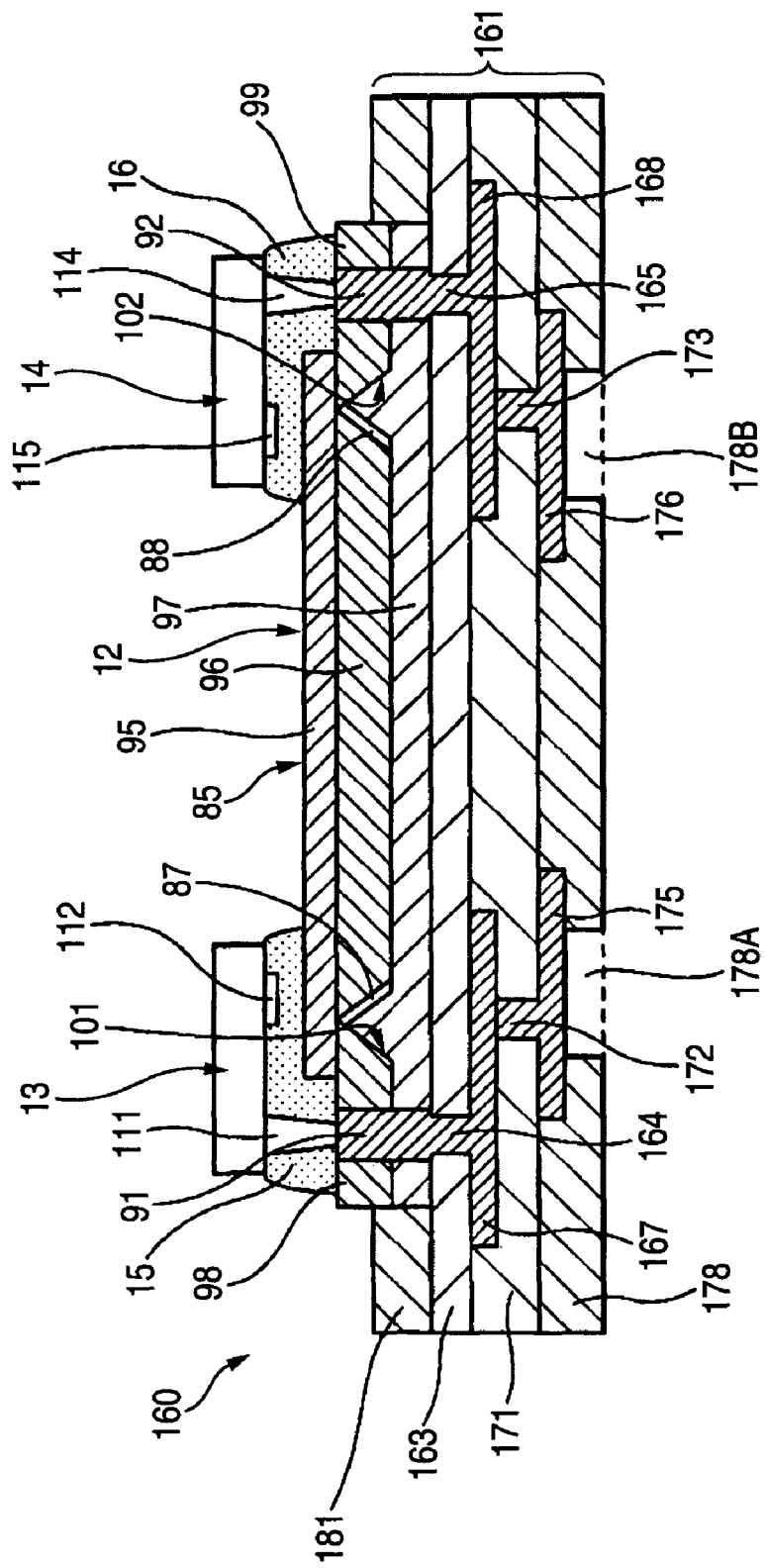
FIG. 37 is a view (#9) showing steps of manufacturing the optical/electrical hybrid substrate according to the third embodiment of the present invention.

Then, in steps shown in FIG. 37, the terminal 111 of the light emitting element 13 is fixed onto the through via 91 by the solder (not shown), and also the underfill resin 15 is formed to fill the clearance between the light emitting element 13 and the optical waveguide 12. Then, the terminal 114 of the light receiving element 14 is fixed onto the through via 92 by the solder (not shown), and also the underfill resin 16 is formed to fill the clearance between the light receiving element 14 and the optical waveguide 12. Thus, the optical/electrical hybrid substrate 160 according to the third embodiment is manufactured.

According to the method of manufacturing the optical/electrical hybrid substrate according to the present embodiment, the built-up structure 161 is formed in the optical waveguide 12. Therefore, a productivity of the optical/electrical hybrid substrate 160 can be improved as compared with the case where the optical waveguide 12 and the built-up structure 161 are manufactured separately.

Also, the method of manufacturing the optical waveguide according to the present embodiment can achieve the similar advantages to the method of manufacturing the optical waveguide 12 described in the first embodiment.

The present invention is applicable to the optical waveguide capable of reducing a transmission loss of the light signal and the method of manufacturing the same and the method of manufacturing the optical/electrical hybrid substrate.

While the present invention has been shown and described with reference to certain exemplary embodiments thereof, it will be understood by those skilled in the art that various changes in form and details may be made therein without departing from the spirit and scope of the invention as defined by the appended claims. It is aimed, therefore, to cover in the appended claim all such changes and modifications as fall within the true spirit and scope of the present invention.

What is claimed is:

1. An optical waveguide, comprising:
an optical waveguide main body comprising:
   a first cladding layer facing at least one of a light emitting element and a light receiving element;
   a second cladding layer; and
   a core portion for transmitting a light signal and provided between the first cladding layer and the second cladding layer; and
mirrors for reflecting the light signal; and
wherein the optical waveguide main body has:
   a first region in which the core portion and the mirrors are arranged and the light signal is transmitted; and
   a second region arranged on both sides of the first region and not contributing to a transmission of the light signal,
wherein through vias that pass through the optical waveguide main body are provided in the second region, and the through vias are connected to a terminal of the light emitting element or a terminal of the light receiving element,
wherein the first region on a side that faces the light emitting element or the light receiving element is protruded larger than the second region on a side that faces the light emitting element or the light receiving element, and
wherein the first cladding layer is provided only in the first region.

2. The optical waveguide of claim 1, wherein both end surface of the through vias are substantially in the same plane as both surfaces of the optical waveguide main body in the second region.

3. A method of manufacturing an optical waveguide including an optical waveguide main body having a first region for transmitting a light signal, and a second region arranged on both sides of the first region and not contributing to a transmission of the light signal, the method comprising:
   (a) forming a first cladding layer on a metal plate in the first region;
   (b) forming a metal film on the metal plate in the second region such that a thickness of the metal film is substantially equal to a thickness of the first cladding layer;
   (c) forming a core material to cover upper surfaces of the first cladding layer and the metal film;
   (d) forming simultaneously a core portion, alignment marks and a first through hole by patterning the core material, said first through hole passing through the core material in the second region;
   (e) forming inclined surfaces on the core portion by cutting the core portion based on the alignment marks;
   (f) forming mirrors on the inclined surfaces of the core portion;
   (g) forming a second cladding layer having a second through hole opposing to the first through hole;
   (h) removing the metal plate and the metal film; and
   (i) forming through vias in the first through hole and the second through hole, said through vias being connected to a terminal of a light emitting element and a terminal of a light receiving element.

4. The method of claim 3, wherein the metal plate and the metal film are removed by an etching in step (h).

5. A method of manufacturing an optical/electrical hybrid substrate including an optical waveguide and a built-up structure including an insulating layer, vias and wirings, said optical waveguide including an optical waveguide main body having a first region for transmitting a light signal, and a second region arranged on both sides of the first region and not contributing to a transmission of the light signal, the method comprising:
   (a) forming a first cladding layer on a metal plate in the first region;
   (b) forming a metal film on the metal plate in the second region such that a thickness of the metal film is substantially equal to a thickness of the first cladding layer;
   (c) forming a core material to cover upper surfaces of the first cladding layer and the metal film;
   (d) forming simultaneously a core portion, alignment marks and a first through hole by patterning the core material, said first through hole passing through the core material in the second region;
   (e) forming inclined surfaces on the core portion by cutting the core portion based on the alignment marks;
   (f) forming mirrors on the inclined surfaces of the core portion;
   (g) forming a second cladding layer having a second through hole opposing to the first through hole;
   (h) forming through vias in the first through hole and the second through hole, said through vias being connected to a terminal of a light emitting element and a terminal of a light receiving element.
   (i) forming the built-up structure on the optical waveguide; and
   (j) removing the metal plate and the metal film.

6. The method of claim 5, wherein the through vias are formed in step (i).

7. The method of claim 5, wherein the metal plate and the metal film are removed by an etching in step (j).

8. The optical waveguide of claim 1, wherein the through vias are directly connected to a terminal of the light emitting element or a terminal of the light receiving element.

9. An optical waveguide, comprising:
an optical waveguide main body comprising:
   a first cladding layer facing at least one of a light emitting element and a light receiving element;
   a second cladding layer; and
   a core portion for transmitting a light signal and provided between the first cladding layer and the second cladding layer; and
mirrors for reflecting the light signal; and
wherein the optical waveguide main body has:
   a first region in which the core portion and the mirrors are arranged and the light signal is transmitted; and
   a second region arranged on both sides of the first region and not contributing to a transmission of the light signal,
wherein through vias that pass through the optical waveguide main body are provided in the second region, and the through vias are connected to a terminal of the light emitting element or a terminal of the light receiving element,
wherein the first region on a side that faces the light emitting element or the light receiving element is protruded larger than the second region on a side that faces the light emitting element or the light receiving element, and
wherein the through vias are directly connected to a terminal of the light emitting element or a terminal of the light receiving element.

* * * * *